US007818651B2

(12) United States Patent
Nagai et al.

(10) Patent No.: US 7,818,651 B2
(45) Date of Patent: *Oct. 19, 2010

(54) SEMICONDUCTOR MEMORY DEVICE HAVING DATA HOLDING MODE USING ECC FUNCTION

(75) Inventors: Takeshi Nagai, Yokohama (JP); Shinji Miyano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1188 days.

This patent is subject to a terminal disclaimer.

(21) Appl. No.: 11/436,600

(22) Filed: May 19, 2006

(65) Prior Publication Data

US 2007/0079218 A1   Apr. 5, 2007

(30) Foreign Application Priority Data

Sep. 16, 2005   (JP)   ............................. 2005-271149

(51) Int. Cl.
 *H03M 13/00*   (2006.01)
(52) U.S. Cl. ...................................... 714/762; 714/763
(58) Field of Classification Search ................. 714/763, 714/762
 See application file for complete search history.

(56) References Cited

U.S. PATENT DOCUMENTS

| 4,688,219 A | * | 8/1987 | Takemae | ..................... 714/711 |
| 4,730,320 A | * | 3/1988 | Hidaka et al. | ............... 714/766 |
| 5,134,616 A | * | 7/1992 | Barth et al. | .................. 714/711 |
| 5,307,356 A | * | 4/1994 | Fifield | ......................... 714/765 |
| 5,313,425 A | * | 5/1994 | Lee et al. | ..................... 365/201 |
| 5,551,054 A | * | 8/1996 | Packer | .......................... 710/23 |
| 5,638,385 A | * | 6/1997 | Fifield et al. | ................. 714/763 |
| 5,784,391 A | * | 7/1998 | Konigsburg | .................. 714/773 |
| 6,697,992 B2 | * | 2/2004 | Ito et al. | ...................... 714/763 |
| 7,193,918 B2 | * | 3/2007 | Harrand et al. | .............. 365/222 |
| 2003/0115538 A1 | * | 6/2003 | Derner et al. | ............... 714/773 |
| 2005/0283650 A1 | * | 12/2005 | Zhang et al. | ................... 714/6 |

FOREIGN PATENT DOCUMENTS

JP   2002-56671   2/2002

* cited by examiner

*Primary Examiner*—M. Mujtaba K Chaudry
(74) *Attorney, Agent, or Firm*—Oblon, Spivak, McClelland, Maier & Neustadt, L.L.P.

(57) ABSTRACT

When memory cells enter a data holding mode, a control circuit of a semiconductor memory device reads out a plurality of data from the memory cells to generate and store a check bit for error detection and correction, and performs a refresh operation in a period within an error occurrence allowable range of an error correcting operation performed by an ECC circuit by using the check bit. Before a normal operation mode is restored from the data holding mode, the control circuit performs control such that an error bit of the data is corrected by using the check bit. In an entry/exit period, read and write are performed by a page operation.

20 Claims, 17 Drawing Sheets

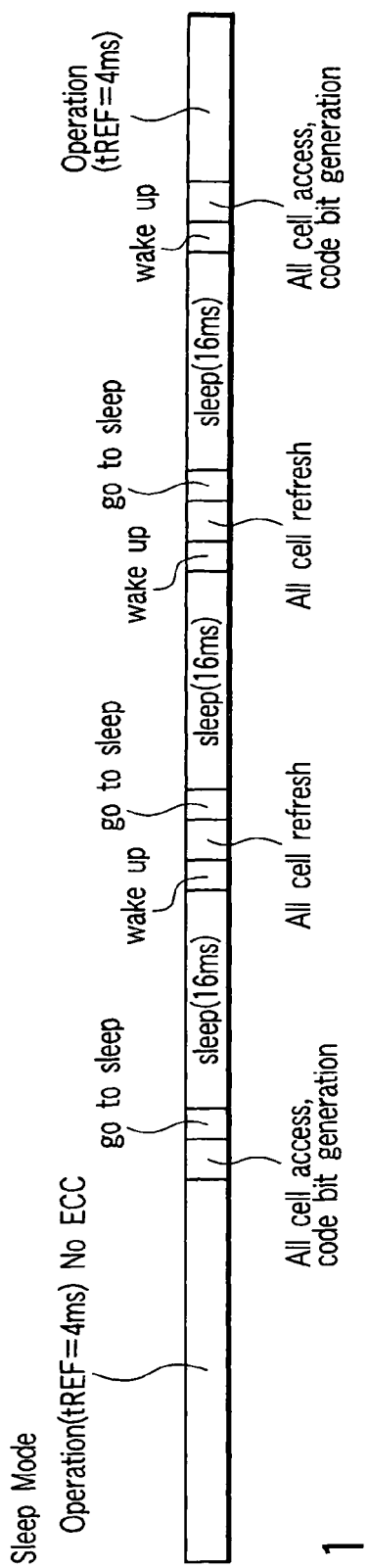
F I G. 1
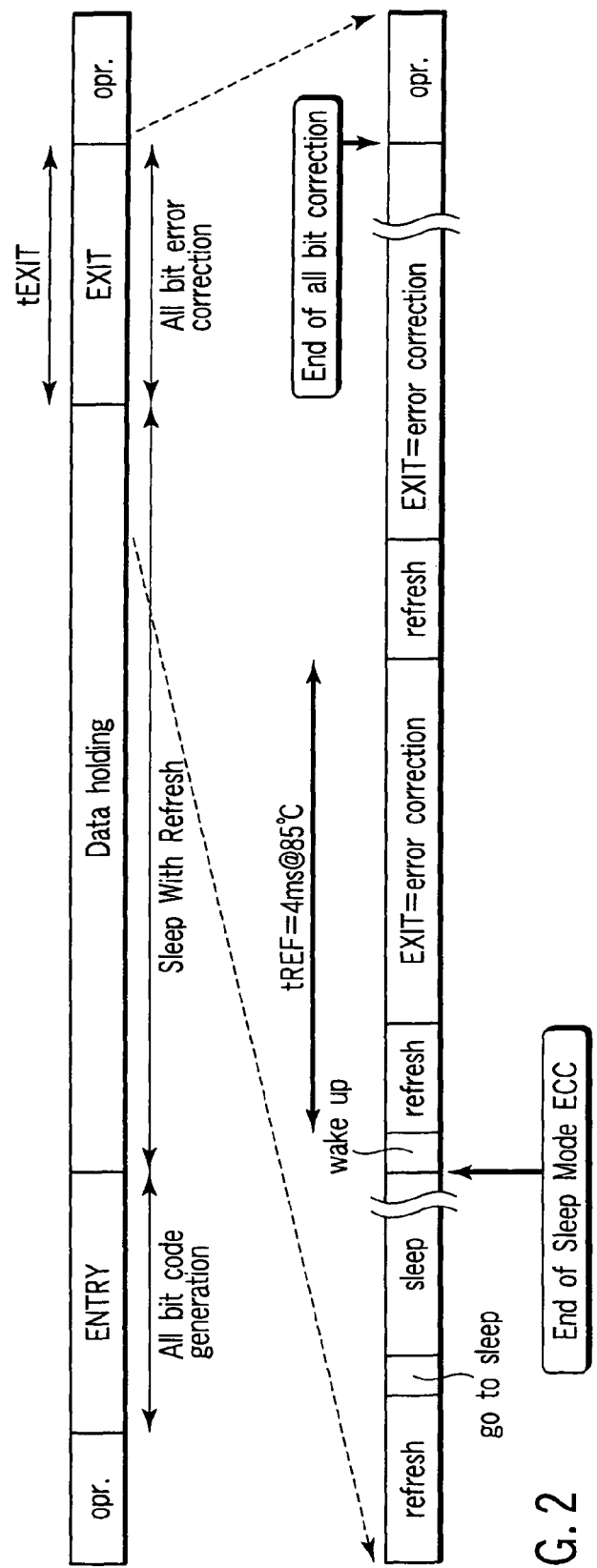
F I G. 2

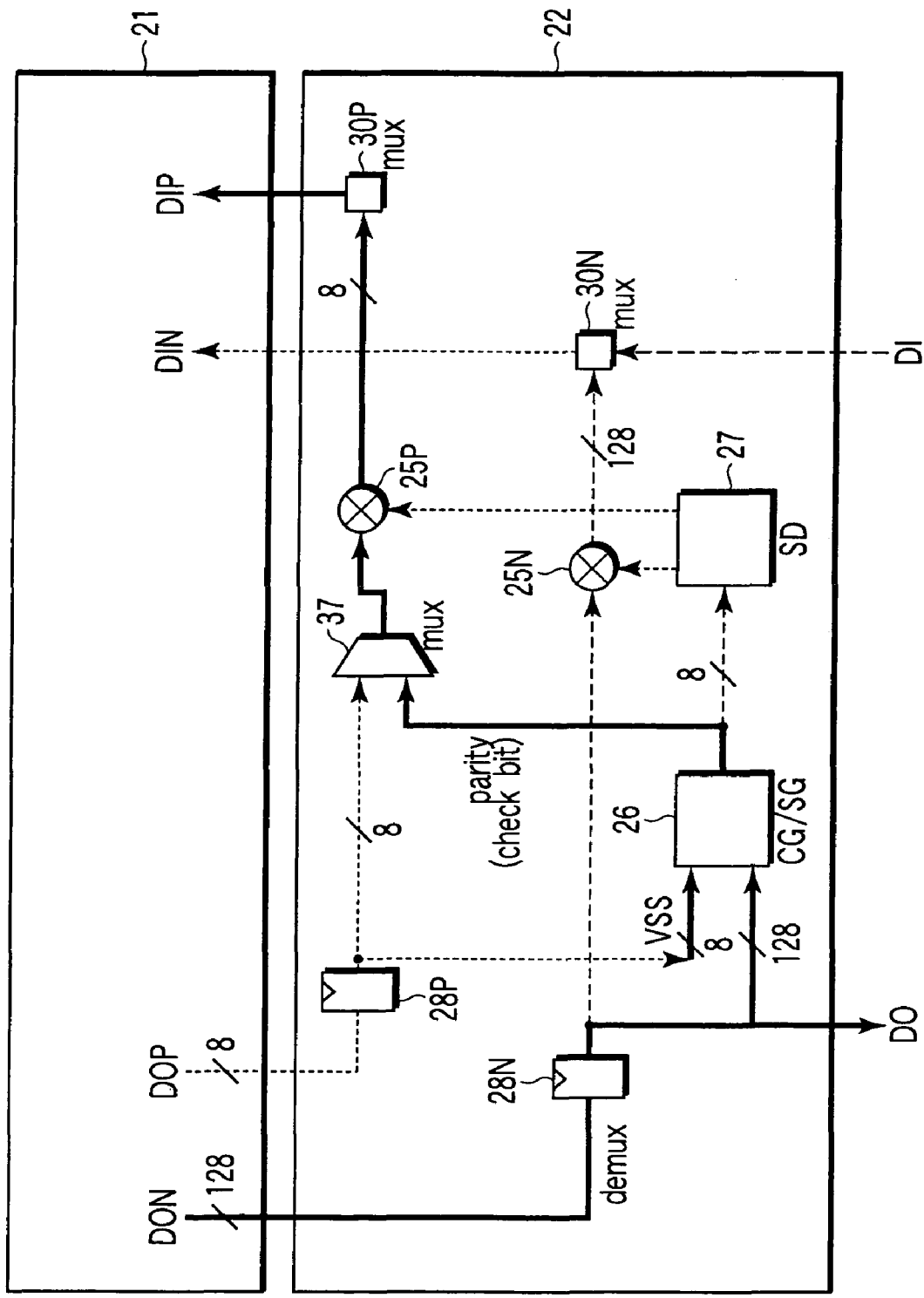
F I G. 8

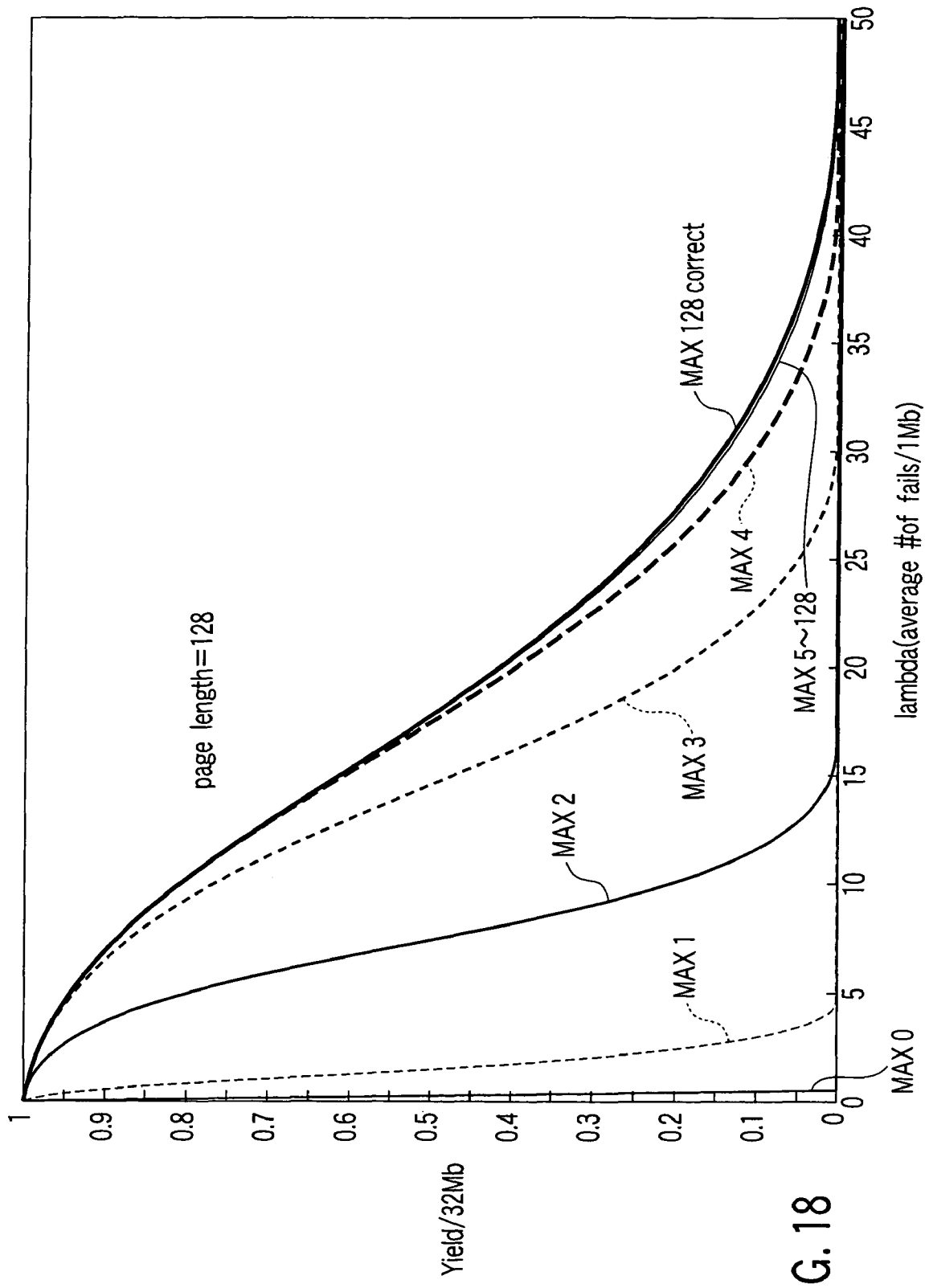
F I G. 18

SEMICONDUCTOR MEMORY DEVICE HAVING DATA HOLDING MODE USING ECC FUNCTION

CROSS-REFERENCE TO RELATED APPLICATIONS

This application is based upon and claims the benefit of priority from prior Japanese Patent Application No. 2005-271149, filed Sep. 16, 2005, the entire contents of which are incorporated herein by reference.

BACKGROUND OF THE INVENTION

1. Field of the Invention

The present invention relates to a semiconductor memory device, e.g., a dynamic random access memory (DRAM), having a data holding mode using an ECC function.

2. Description of the Related Art

A conventionally known example of semiconductor memory devices of this type is "a data holding method of a dynamic RAM and a semiconductor integrated circuit device" disclosed in Jpn. Pat. Appln. KOKAI Publication No. 2002-56671. This patent reference has proposed a method of correcting an error bit as follows at the start of an operation mode in which a DRAM performs only a data holding operation. That is, when this operation mode starts, parity bits (or check bits) for detecting and correcting errors are generated and stored for a plurality of data, and refresh is performed by extending the refresh period within the error occurrence allowable range of an error correcting operation using the parity bits. Before the data holding operation returns to a normal operation, error bits are corrected by using the data and parity bits.

FIG. 23 of the patent reference described above is a timing chart showing timings from the end of an entry operation to the start of the data holding mode, and timings from the data holding mode to the start of an exit operation. In this method, read of data from all memory cells and write of generated parity bits are performed in an entry period during which the normal operation changes to the data holding mode. Also, in an exit period during which the data holding mode changes to the normal operation, codes, i.e., information bits and the parity bits are read out from all the memory cells, errors are detected and corrected, and the corrected data is rewritten.

Since, however, these operations are performed for all the memory cells, the transition time from the start of the exit operation to the start of the normal operation is very long.

BRIEF SUMMARY OF THE INVENTION

According to an aspect of the present invention, there is provided a semiconductor memory device comprising memory cells which dynamically hold data, ECC circuits which perform error correction on codes read out from the memory cells, and a control circuit which controls operations of the memory cells and operations of the ECC circuits, the control circuit performing control such that when the memory cells enter a data holding mode, a plurality of data are read out from the memory cells to generate and store a check bit for error detection and correction, and a refresh operation is performed in a period within an error occurrence allowable range of the error correcting operation performed by the ECC circuit by using the check bit, and, before a normal operation mode is restored from the data holding mode, an error bit of the data is corrected by using the check bit, wherein in an entry/exit period, read and write are performed by a page operation, and, when $n$ cycles are necessary from a read command to data output determination, one cycle is necessary for a write operation, and $m$ cycles are necessary for an ECC operation, a page length $k$ is a multiple of (n+m), and the page operation repeats (n+m)-time consecutive read and (n+m)-time consecutive write k/(n+m) times.

According to another aspect of the present invention, there is provided a semiconductor memory device comprising memory cells which dynamically hold data, ECC circuits which have first registers and perform error correction on codes read out from the memory cells, and a control circuit which has a second register and controls operations of the memory cells and operations of the ECC circuits, the control circuit performing control such that when the memory cells enter a data holding mode, a plurality of data are read out from the memory cells to generate and store a check bit for error detection and correction, and a refresh operation is performed in a period within an error occurrence allowable range of the error correcting operation performed by the ECC circuit by using the check bit, and, before a normal operation mode is restored from the data holding mode, an error bit of the data is corrected by using the check bit, wherein in an exit period, a continuous read operation is performed by a page operation, and the ECC circuit performs an error correcting operation on a readout code, when correction occurs, corrected data and error correction information are stored in the first register, and a column address storing a code for which correction has occurred is stored in the second register, and immediately after a last command of the continuous read of the page is input, the corrected data stored in the first register is rewritten in the memory cells.

According to still another aspect of the present invention, there is provided a semiconductor memory device comprising memory cells which dynamically hold data, ECC circuits which perform error correction on codes read out from the memory cells, and a control circuit which has an address counter and controls operations of the memory cells and operations of the ECC circuits, the control circuit performing control such that when the memory cells enter a data holding mode, a plurality of data are read out from the memory cells to generate and store a check bit for error detection and correction, and a refresh operation is performed in a period within an error occurrence allowable range of the error correcting operation performed by the ECC circuit by using the check bit, and, before a normal operation mode is restored from the data holding mode, an error bit of the data is corrected by using the check bit, wherein in an exit period, a continuous read operation is performed by a page operation for a column address supplied from the address counter, and the ECC circuit performs an error correcting operation on a readout code, and when correction occurs, the address counter is stopped, corrected data is rewritten at a column address which designates a location in which the corrected data is stored, and the address counter is restarted to continue the read operation after the rewrite is completed.

BRIEF DESCRIPTION OF THE SEVERAL VIEWS OF THE DRAWING

FIG. 1 is a schematic view for explaining an outline of the operation of a semiconductor memory device as the premise of the present invention, in which a data holding mode is illustrated;

FIG. 2 is a schematic view for explaining precautions of a refresh operation during entry and exit periods;

FIG. 8 is a block diagram for explaining the details of a portion which performs an encoding operation in an ECC block shown in FIG. 7;

FIG. 18 is a graph showing the relief efficiency when the page length is 128 bits;

DETAILED DESCRIPTION OF THE INVENTION

Figure 3:
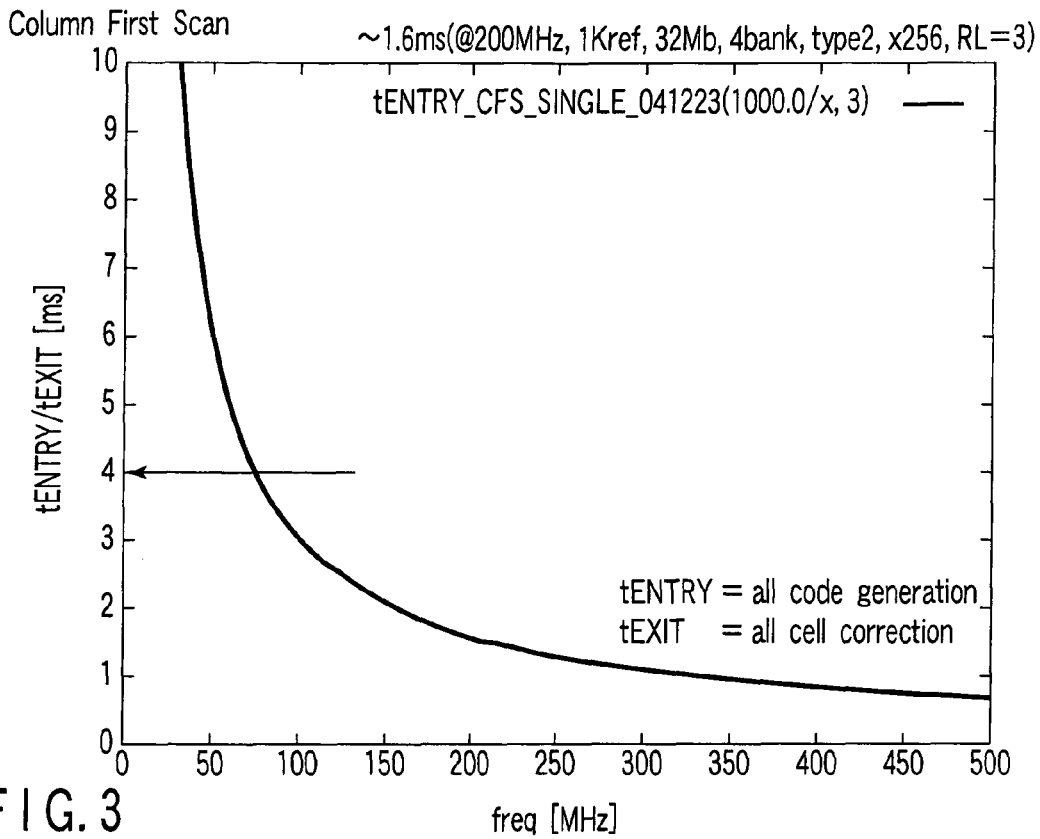
FIG. 3 is a diagram roughly estimating the entry/exit transition time in the case of CFS (Column First Scan)

In a semiconductor memory device according to an embodiment of the present invention, at least one of methods (1) to (4) to be described below is used in an exit period during which a data holding mode changes to a normal operation mode. Since this can shorten the entry/exit transition time, the normal operation mode can be rapidly restored from the data holding mode. In addition, the power consumption can be effectively reduced if a part of the operation is omitted.

(1) Data read, code generation, error detection and correction, code write, decoding, and rewrite are seamlessly performed by optimizing the pipeline configuration. This reduces extra registers, and shortens the entry/exit transition time.

(2) If no error is found by an ECC function, a rewrite operation is omitted.

(3) When data is to be read out and corrected data is to be rewritten by a page operation, an upper limit is set for the number of page cycles for rewriting the corrected data, so that the number of times of rewrite is always smaller than the page length.

(4) When data is to be read out and errors are to be detected by a page operation, an upper limit is set for the number of times of error detection, so that this number is smaller than the page length. If the number of times of error detection is equal to this upper limit, data read in the page cycle and the corresponding error correcting operation and corrected data rewrite operation are omitted.

First, a practical operation and arrangement of a semiconductor memory device as the premise which implements methods (1) to (4) above will be explained below in order with reference to FIGS. 1 to 5.

FIG. 1 is a schematic view showing an outline of the operation of the semiconductor memory device as the premise of the present invention, in which a data holding mode is illustrated. In a normal operation, this semiconductor memory device operates at refresh interval tREF=4 ms (no ECC). To start the data holding mode, code bits are generated by accessing all memory cells and written in the memory cells in an entry period. Since the present invention is premised on the use of organizing codes, information bits are directly contained in the code bits. A portion of code bits from which information bits are omitted will be referred to as parity bits hereinafter. Only the parity bits need be written in the memory cells during the entry period. After code bits are written by accessing all the cells, the data holding mode starts.

In the operation shown in FIG. 1, a sleep mode starts at the end of entry in order to reduce the power consumption. A so-called MT-CMOS (Multi Threshold CMOS) technique or VT-CMOS (Variable Threshold CMOS) technique is known as a technique which implements this sleep mode. In the MT-CMOS technique, for example, switching transistors whose threshold voltage is high are formed between a GND line and the sources of MOSFETs connected to the GND forming a memory peripheral circuit or these switching transistors are formed between a VDD line and the drains of MOSFETs connected to the VDD, and a leakage current is reduced by turning off these switching transistors. The VT-CMOS technique reduces a leakage current by changing the threshold voltage by adjusting the back gate bias of MOSFETs. That is, the sleep mode herein mentioned means a state in which a leak cut operation is performed.

When the data holding mode starts, the refresh interval tREF can be increased by an ECC function. Assuming that tREF=4 ms in the normal operation can be increased to tREF=16 ms in the data holding mode, at least one refresh operation of all cells is necessary within tREF=16 ms from the start of the data holding mode. To perform the refresh operation, it is necessary to restore the power supply and changed threshold voltage of a leak-cut circuit required for the operation. Before the refresh of all cells, therefore, a "wake up" operation for returning from sleep is necessary, and a "go to sleep" operation for restarting the sleep mode at the end of the refresh of all cells is necessary.

To advance to the normal operation mode from this repetition of sleep→"wake up"→refresh→"go to sleep", it is initially necessary to perform a decoding operation by accessing all cells during an exit period after "wake up" from sleep. That is, code bits are read out, errors are detected and corrected, and the corrected data is rewritten in memory cells. When data decoding of all the cells is completed, the normal operation mode starts.

FIG. 2 is a schematic view for explaining precautions of the refresh operation during the entry and exit periods. More specifically, FIG. 2 shows an operation when the length of error correction performed during the exit period is larger than the refresh interval tREF (4 ms).

RFS (Row First Scan) and CFS (Column First Scan) are often used in addressing which accesses memory cells. RFS is a method which accesses all rows by incrementing row addresses first, and then increments column addresses. CFS is a method which increments column addresses first, and then increments row addresses.

In CFS, caution should be exercised because a memory cell retention error occurs if all rows cannot be accessed within tREF=4 ms as the normal interval during the entry or exit period. This error cannot be relieved by the ECC function since it occurs in the middle of the entry/exit period. Accordingly, to satisfy the limitation of tREF=4 ms, the refresh operation must be performed even in the middle of the entry/exit period.

In this case, if all cell access in entry/exit is to be performed by RFS, row addresses are incremented first, so the refresh limitation is satisfied in most cases. On the other hand, if a page operation is to be performed by CFS, a plurality of columns are accessed in one row cycle, so it takes a long time to access all rows. In a semiconductor memory device having a slow clock and a large memory capacity, therefore, the cycle time cannot satisfy the refresh limitation any longer, so the refresh operation must be performed during the course of the process.

From the viewpoint of the entry/exit transition time, however, when a page operation is performed by CFS, the transition time shortens as the page length increases. When RFS is used, on the other hand, the refresh limitation is no longer a big problem, but time intervals such as tRCD from the activation of rows to the start of column access, tWR from a write command to a row precharge command, and tRP from the row precharge command to a next row active command are necessary in one row access. This largely increases the transition time.

Figure 4:
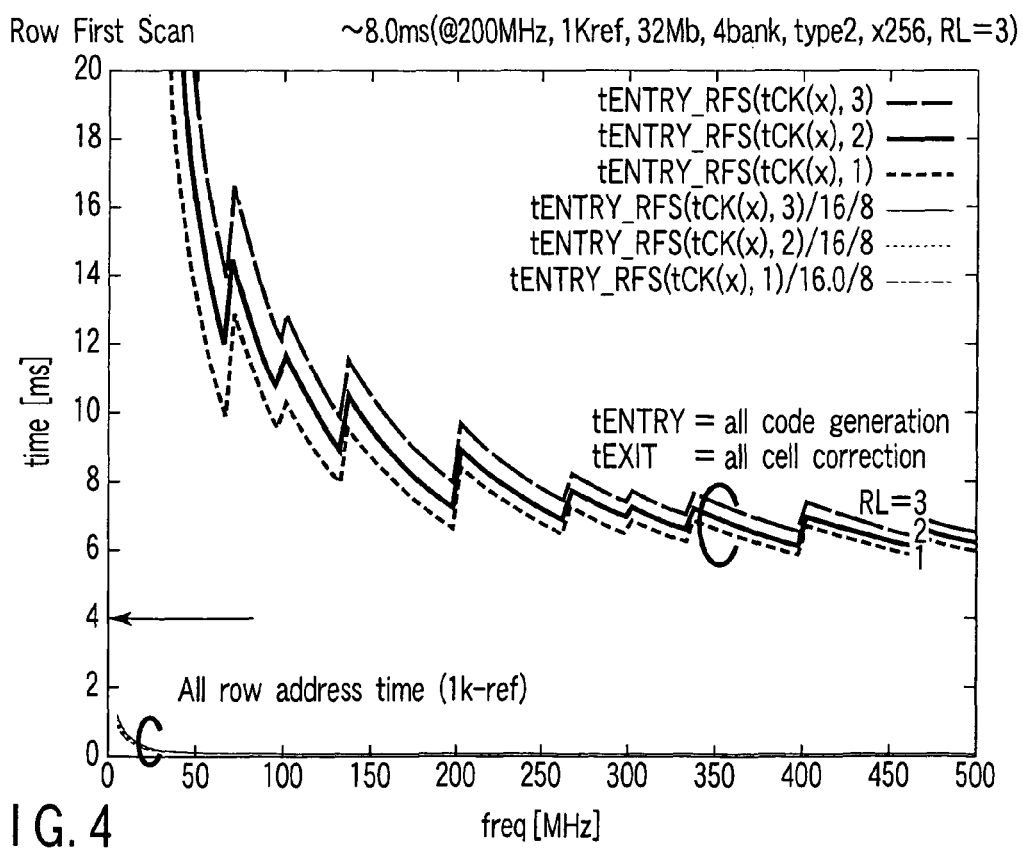
FIG. 4 is a diagram roughly estimating the entry/exit transition time in the case of RFS (Row First Scan)
Figure 5:
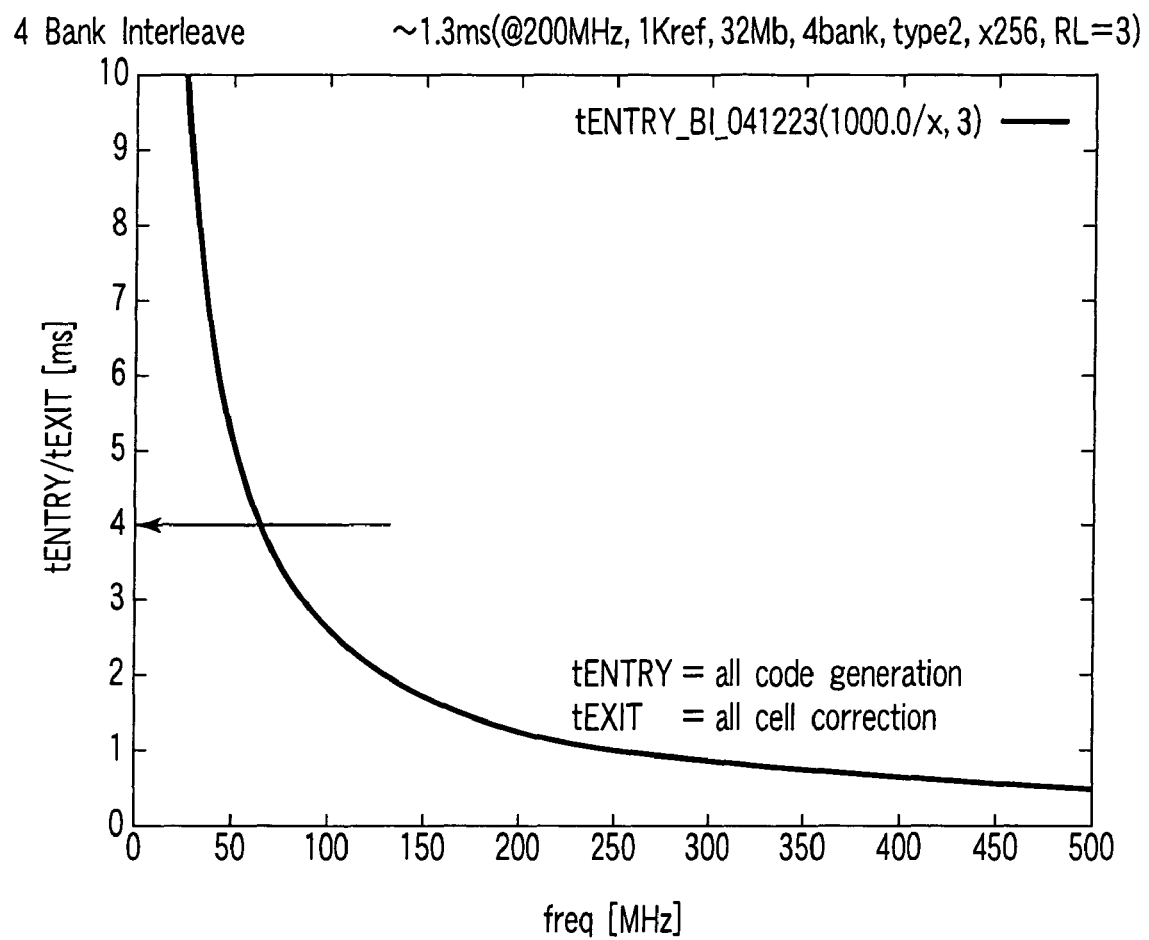
FIG. 5 is a diagram roughly estimating the entry/exit transition time when bank interleave is used.

FIGS. 3 to 5 are diagrams roughly estimating the time intervals described above. The arrangement of an assumed semiconductor memory device is as shown in these diagrams. FIGS. 3, 4, and 5 illustrate cases which use CFS, RFS, and bank interleave, respectively. More specifically, FIG. 3 shows the relationship between a frequency freq [MHz] and tENTRY (all code generation)/tEXIT (all cell correction) [ms]. If ENTRY/EXIT requires 4 ms or more (indicated by an arrow), refresh is necessary in the middle of processing. FIG. 4 shows the relationship between the frequency freq [MHz] and time [ms]. Since time [ms]=tENTRY (all code generation)/tEXIT (all cell correction) [ms], no refresh is necessary even if ENTRY/EXIT requires 4 ms or more. FIG. 5 shows the relationship between the frequency freq [MHz] and tENTRY (all code generation)/tEXIT (all cell correction) [ms] when bank interleave is used. If ENTRY/EXIT requires 4 ms or more (indicated by an arrow), refresh is necessary in the middle of processing.

Figure 6:
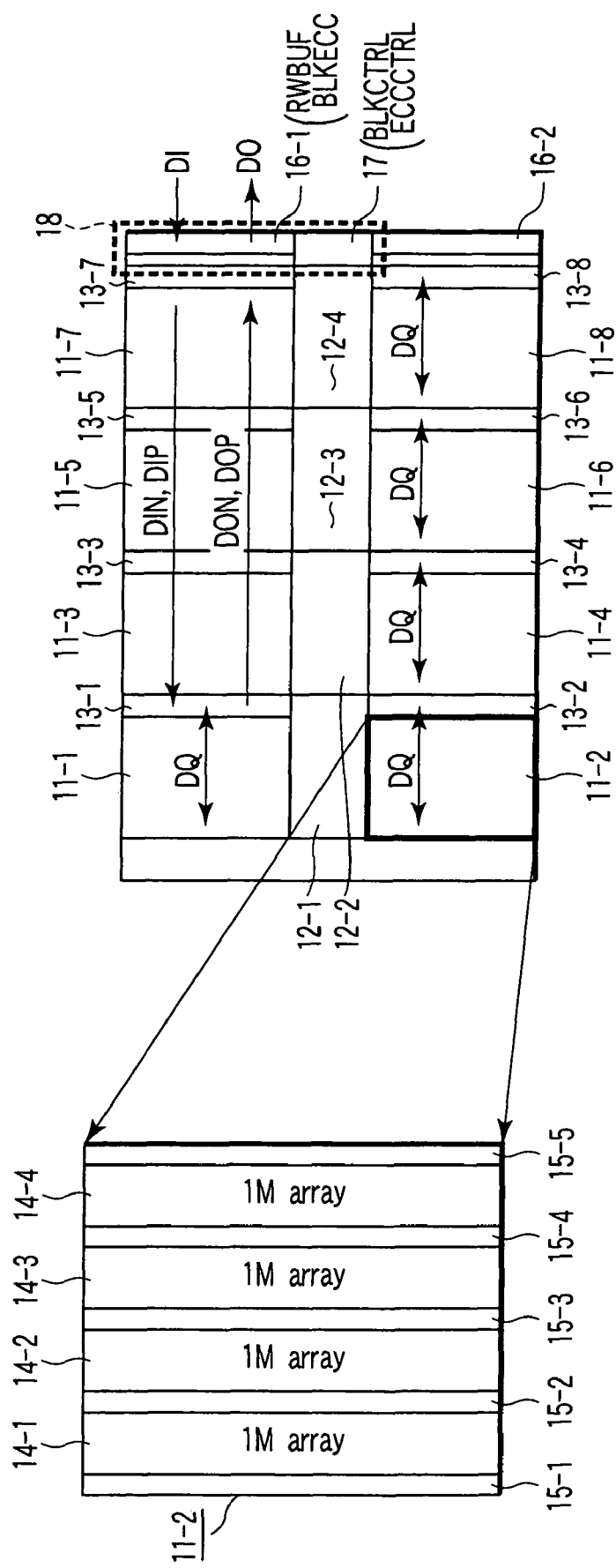
FIG. 6 is a block diagram for explaining an arrangement of a semiconductor memory device according to an embodiment of the present invention, in which the overall view of a DRAM macro is illustrated.

FIG. 6 is a block diagram for explaining an arrangement of a semiconductor memory device according to an embodiment of the present invention, in which the overall view of a DRAM macro is schematically illustrated. This DRAM macro includes eight banks (4-Mbit sub macros) 11-1 to 11-8. Decoder blocks 12-1, 12-2, 12-3, and 12-4 are arranged between the banks 11-1 and 11-2, 11-3 and 11-4, 11-5 and 11-6, and 11-7 and 11-8, respectively. Also, secondary sense amplifiers 13-1, 13-2, 13-3, 13-4, 13-5, and 13-6 are arranged between the banks 11-1 and 11-3, 11-2 and 11-4, 11-3 and 11-5, 11-4 and 11-6, 11-5 and 11-7, and 11-6 and 11-8, respectively, and secondary sense amplifiers 13-7 and 13-8 are placed adjacent to the banks 11-7 and 11-8, respectively.

In each of the banks 11-1 to 11-8, as representatively shown by the bank 11-2, 1-Mbit memory cell arrays (1M arrays) 14-1 to 14-4 are arranged. Sense amplifiers 15-1 to 15-5 alternately sandwich the memory cell arrays 14-1 to 14-4.

ECC circuits 16-1 and 16-2 are formed adjacent to the secondary sense amplifiers 13-7 and 13-8, respectively. A read/write buffer (RWBUF), ECC block (BLKECC), and the like are formed in each of the ECC circuits 16-1 and 16-2. In addition, a control circuit 17 is placed in that region between the ECC circuits 16-1 and 16-2, which is adjacent to the decoder block 12-4. The control circuit 17 contains, e.g., a block controller (BLKCTRL) and ECC controller (ECCCTRL).

Data DI is input to the ECC circuits 16-1 and 16-2 from outside the DRAM macro. The data DI is supplied to the secondary sense amplifiers 13-7, 13-5, 13-3, and 13-1, and the secondary sense amplifiers 13-8, 13-6, 13-4, and 13-2, via input data lines DIN and DIP. The input data line DIN transfers normal data, and the input data line DIP transfers parity data. The data DI input to the secondary sense amplifiers 13-1 to 13-8 is supplied to selected memory cells in the memory cell arrays 14-1 to 14-4 via DQ lines in the corresponding banks 11-1 to 11-8 and the sense amplifiers 15-1 to 15-5.

On the other hand, data read out from a memory cell is amplified by one of the sense amplifiers 15-1 to 15-5 which corresponds to one of the memory cell arrays 14-1 to 14-4 which contains this memory cell, and transferred to the DQ line. This data on the DQ line is further amplified by one of the secondary sense amplifiers 13-1 to 13-8, supplied to the ECC circuit 16-1 or 16-2 via output data lines DON and DOP, and output outside as output data DO. The output data line DON transfers normal data, and the output data line DOP transfers parity data.

Figure 7:
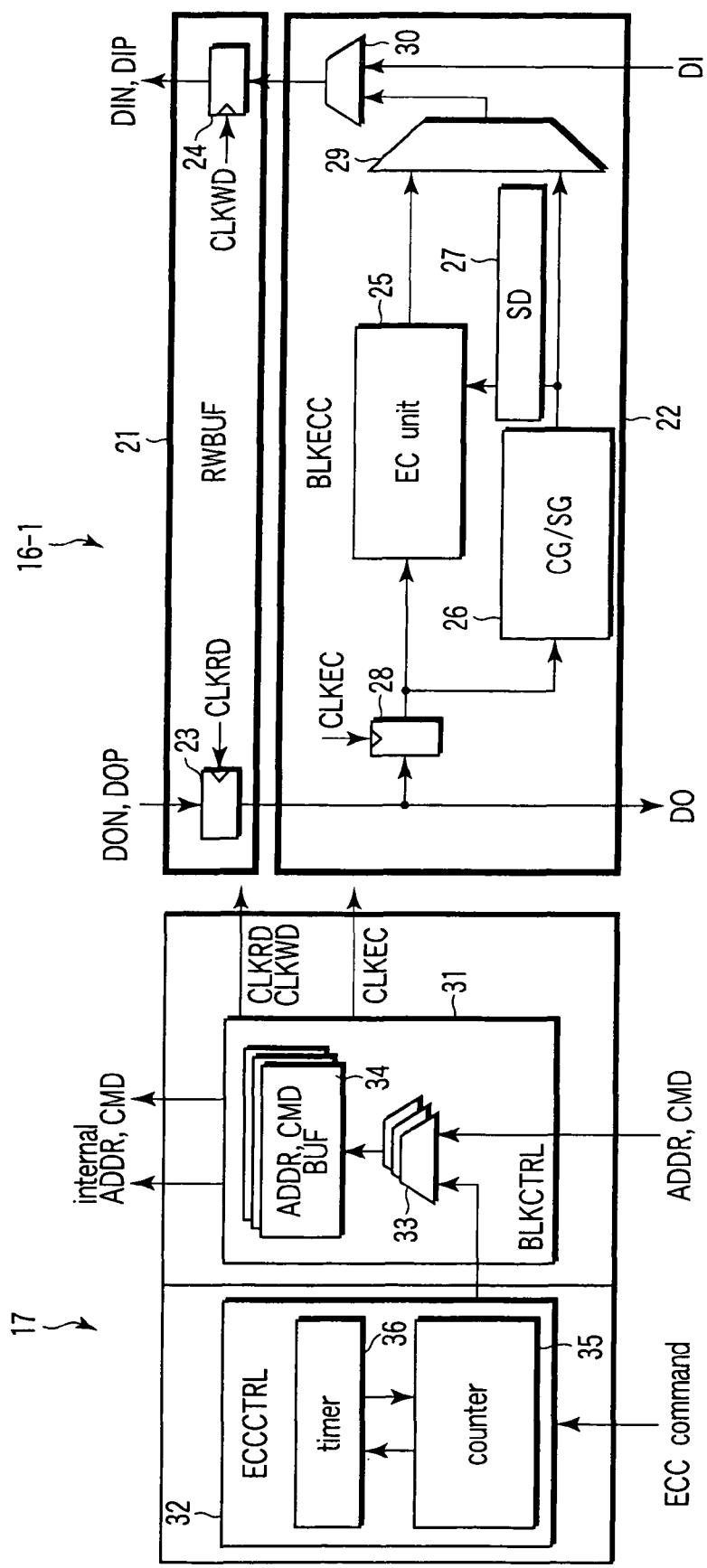
FIG. 7 is a block diagram showing a practical arrangement of a region surrounded by the broken line in the circuit shown in FIG. 6.

FIG. 7 is a block diagram showing a practical arrangement of a region (including the ECC circuit 16-1 and control circuit 17) surrounded by a broken line 18 in the circuit shown in FIG. 6. In the ECC circuit 16-1, a read/write buffer (RWBUF) 21 and ECC block (BLKECC) 22 are formed. The read/write buffer 21 contains a read buffer (flip-flop) 23 which is controlled by a read clock signal CLKRD, and a write buffer (flip-flop) 24 which is controlled by a write clock signal CLKWD. The ECC block 22 contains, e.g., an EC (Error Correction) unit 25, a code generator/syndrome generator (CG/SG) 26, a syndrome decoder (SD) 27, a buffer (flip-flop) 28 which is controlled by an ECC clock signal CLKEC, and multiplexers 29 and 30.

The input data DI is supplied to one input terminal of the multiplexer 30. The other input terminal of the multiplexer 30 receives the output signal from the multiplexer 29. The output signal from the multiplexer 30 is supplied to the buffer 24. The buffer 24 operates in response to the write clock signal CLKWD. In a normal operation, the buffer 24 supplies the input data DI, which is input from outside the DRAM macro, to the input data lines DIN and DIP. The write clock signal CLKWD is activated in synchronism with a write command input to the DRAM macro.

The multiplexer 30 selects the input data DI in the normal operation, i.e., when no ECC is functioning, and selects the output signal from the multiplexer 29 in an ECC operation so that the signal is written in a memory cell.

Data read out from a memory cell to the output data lines DON and DOP is input to the read buffer 23 in response to the read clock signal CLKRD. The read clock signal CLKRD is activated at a timing determined by a read command input to the DRAM macro. The output signal from the buffer 23 is supplied to the buffer 28, and output outside as the output data DO after an elapse of clocks corresponding to the read latency from the read command input timing.

The buffer 28 receives the output signal from the buffer 23 in response to the ECC clock signal CLKEC which lags behind the clock signal CLKRD by one clock. The output signal from the buffer 28 is supplied to the EC unit 25 and code generator/syndrome generator 26. The output signals from the EC unit 25 and code generator/syndrome generator 26 are supplied to the multiplexer 29. During code generation, the multiplexer 29 selectively outputs check bit data which is output from the code generator/syndrome generator 26. During error correction, the multiplexer 29 selectively outputs data corrected by the EC unit 25 on the basis of error position information obtained by decoding the output syndrome from the code generator/syndrome generator 26 by the syndrome decoder 27.

The control circuit 17 contains a block controller (BLKC-TRL) 31 and ECC controller (ECCCTRL) 32. The block controller 31 contains a multiplexer 33 and address and command buffer (ADDR, CMD BUF) 34. The ECC controller 32 contains a counter 35 and timer 36.

An ECC command is supplied to the counter 35, and the output from the counter 35 is supplied to the timer 36. The time measurement result obtained by the timer 36 is supplied to the counter 35. The output signal from the ECC controller 32 and an address and command (ADDR, CMD) are supplied to the multiplexer 33. In the normal operation, the multiplexer 33 selects an address and command from outside the DRAM macro to control the interior of the macro. In the ECC operation, the multiplexer 33 selects an address and command output from the ECC controller 32. The output signal from the multiplexer 33 is supplied to the address and command buffer 34.

An internal address and command are supplied from the address and command buffer 34 to a memory cell. Also, the read clock signal CLKRD, write clock signal CLKWD, and ECC clock signal CLKEC output from the block controller 31 are supplied to the buffers 23, 24, and 28, respectively.

FIG. 8 is a block diagram for explaining the details of a portion which performs an encoding operation in the ECC block 22 shown in FIG. 7. The same reference numerals as in FIG. 7 denote the same parts in FIG. 8. Also, reference numerals (25N, 28N, and 30N) suffixed with N denote components for information bits, and reference numerals (25P, 28P, and 30P) suffixed with P denote components for parity bits. The information length is 128 bits, and the check symbol length, i.e., parity bits mentioned in the embodiment of the present invention are 8 bits. The code length is "128 bits+8 bits"=136 bits, and 1-bit error correction is performed. When only 64 bits (Half) on one side are to be used, (Full) code generation/error correction is performed by assuming that there are 128 bits on one side.

Referring to FIG. 8, paths for generating parity are indicated by solid line arrows. 128-bit information bits data read out from a memory cell array to the output data line DON of the read/write buffer 21 is supplied to a buffer 28N. The 128-bit data output from the buffer 28N and 8-bit parity bits data fixed to a VSS (ground potential) level are supplied to the code generator/syndrome generator 26. Parity bits (check bits) generated by the code generator/syndrome generator 26 is supplied to an EC unit 25P via a multiplexer 37. The 8-bit parity bits output from the EC unit 25P is supplied to a multiplexer 30P, and then supplied to a memory cell via the input data line DIP.

On the other hand, in FIG. 8, 8-bit parity bits read data read out to the output data line DOP of the read/write buffer 21 need not be output outside the DRAM macro, and no parity bits write data is input from outside the DRAM macro. That is, the encoding operation is performed using only data read out from a memory cell array, and no parity bits data is exchanged with the outside.

Figure 9:
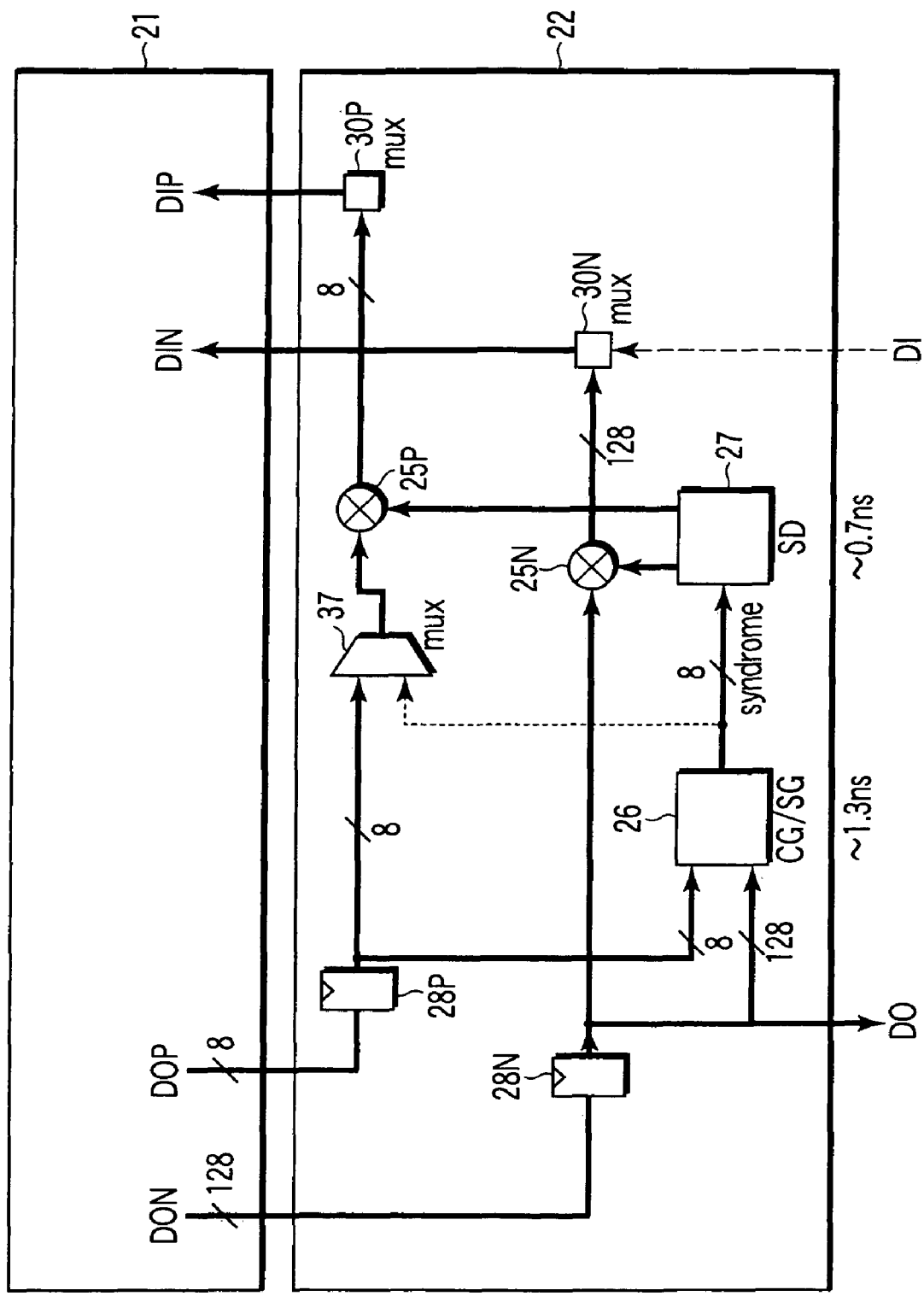
FIG. 9 is a block diagram for explaining the details of a portion which performs a decoding operation in the ECC block shown in FIG. 7.

FIG. 9 is a block diagram showing a portion which performs a decoding operation, i.e., performs syndrome generation, syndrome decoding, and error correction, in the ECC block 22 shown in FIG. 7. The same reference numerals as in FIG. 7 denote the same parts in FIG. 9. Also, as in FIG. 8, reference numerals (25N, 28N, and 30N) suffixed with N denote components for information bits, and reference numerals (25P, 28P, and 30P) suffixed with P denote components for parity bits. Referring to FIG. 9, paths for correcting an error are indicated by solid line arrows.

128-bit information bits data output from a memory cell array to the output data line DON of the read/write buffer 21 is supplied to a buffer 28N, and 8-bit parity bits data read out to the output data line DOP is supplied to a buffer 28P. The 128-bit information bits data and 8-bit parity bits data output from the buffers 28N and 28P, respectively, are supplied to the code generator/syndrome generator 26. The output 128-bit information bits data from the buffer 28N is also supplied to an EC unit 25N, and the output 8-bit parity bits data from the buffer 28P is also supplied to an EC unit 25P via a multiplexer 37. An 8-bit syndrome generated by the code generator/syndrome generator 26 is supplied to the syndrome decoder 27. The syndrome is decoded, and fail data is corrected by controlling the EC units 25P and 25N on the basis of the obtained error position information. The output 8-bit parity bits from the EC unit 25P is supplied from a multiplexer 30P to a memory cell via the input data line DIP, and the 128-bit data is supplied from a multiplexer 30N to the memory cell via the input data line DIN.

Note that FIGS. 8 and 9 are explained by using a compressed hamming code capable of correcting one error as a code, but any other code can also be used.

Figure 10:
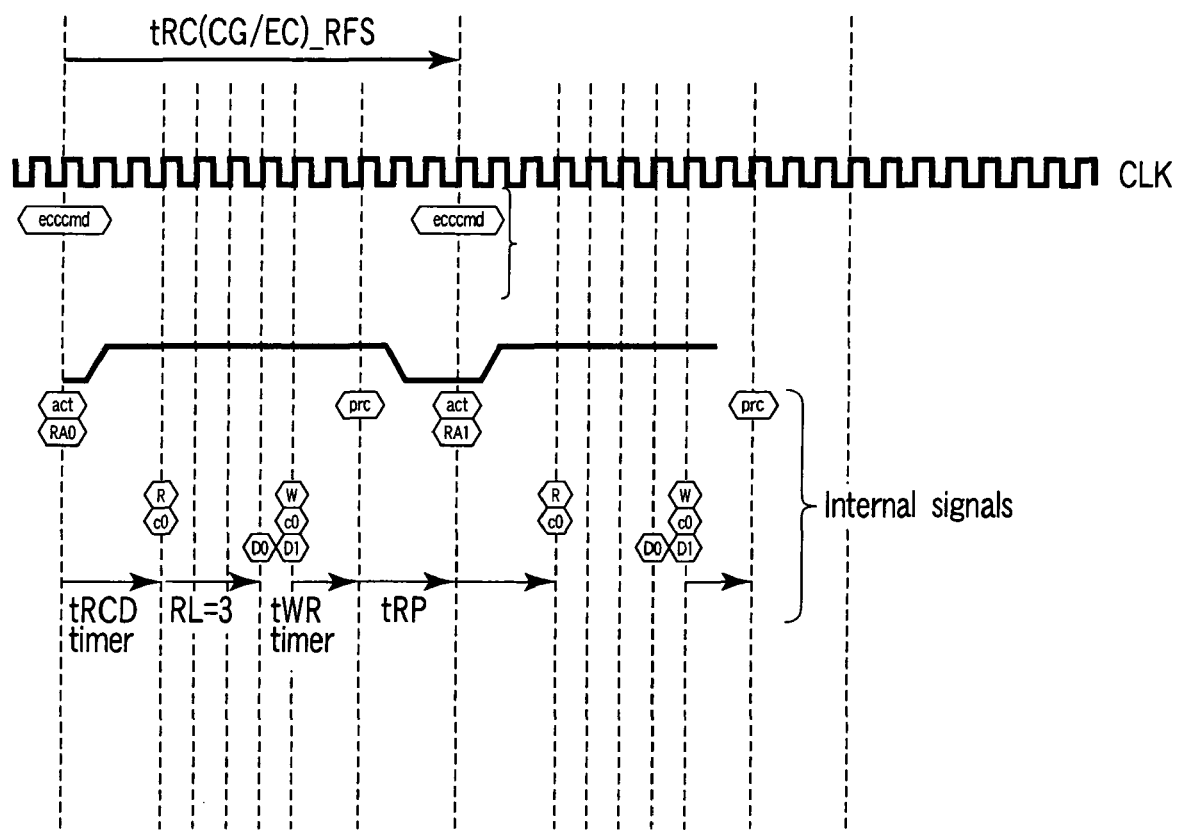
FIG. 10 is a timing chart in the case of RFS.

FIG. 10 shows a timing chart of RFS. In the case of auto-exit/entry, a row cycle start command is externally input, and addresses are generated by an internal counter. In the case of self-exit/entry, an entry/exit command for starting a row cycle is automatically generated by an internal timer, and addresses are generated by the internal counter.

When a row active command <act> is activated (in this state, the row address is <RA0>), the row is activated, and the potential of a word line rises. The row active command <act> is generated by the internal circuit when an entry command <ecccmd> is input. A read command <R> is generated (the column address is <c0>) after an elapse of time tRCD from the input timing of the entry command <ecccmd>, and 128-bit data (in the case of exit, 136-bit data including parity bits) is read out from a memory cell array.

After an elapse of the read latency (in this case, RL=3) from the generation timing of the read command <R>, data <D0> is input to the ECC circuit, and code generation (in the case of exit, error correction) is performed. In the next cycle, an internal write command <W> (the column address is <c0>) is generated, and parity bits (in the case of exit, corrected data) are written in a memory cell. After an elapse of time tWR from the generation timing of the internal write command <W>, an internal precharge command <prc> is generated, and the row address <RA0> is precharged. After an elapse of time tRP from this timing, a row active command <act> for activating an incremented row address <RA1> is input. After that, a similar operation is repeated by sequentially changing the row address.

Figure 11:
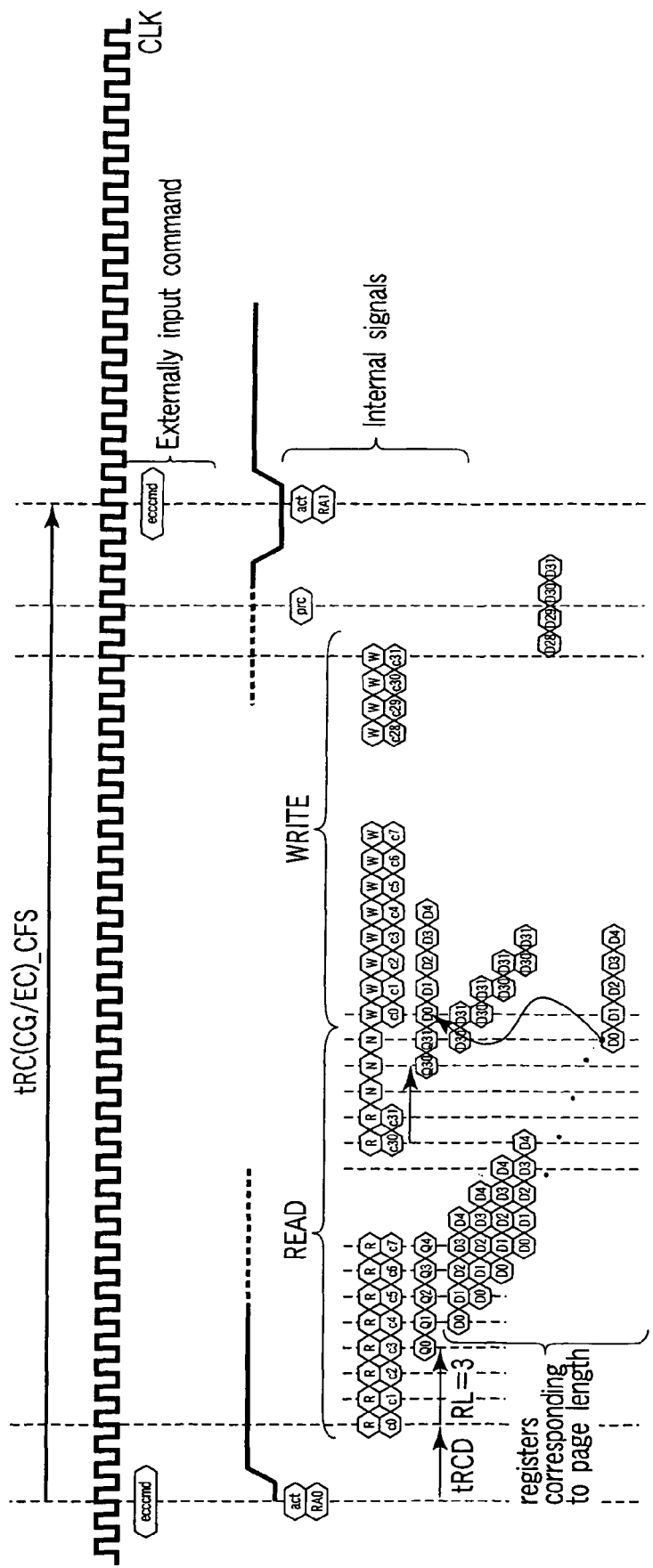
FIG. 11 is a timing chart of an operation for a page length of 32 bits in the case of CFS.

FIG. 11 is a timing chart which assumes an operation of page length=32 by CFS. A series of row commands are the same as in FIG. 10. In a column operation, however, read commands <R> are successively input in 32 cycles from a column address <c0> to a column address <c31> after an elapse of time tRCD from a row active command <act>. Since the read latency (RL) is 3, read data <Q0> is output after an elapse of RL=3 with respect to a command <R> for the first column address <c0>. For the read data <Q0>, an output <D0> from the ECC circuit is output after an elapse of one cycle. After read is performed in 32 consecutive columns, NOP (No OPeration) commands <N> are input in 3 cycles, and write commands <w> for the column addresses <c0> to <c31> are successively input in 32 columns after that. This write data contains parity bits generated by the ECC circuit or is corrected decoded data <Di>, with respect to each read data <Qi> obtained by read.

To implement the operation as described above, a large number of registers corresponding to 32 (page length)×136 bits (code length) are necessary, and the NOP commands <N> must be inserted between read and write. In a semiconductor memory device according to each embodiment to be explained below, therefore, the number of registers is decreased, and the decrease in speed caused by a pipeline disturbance resulting from the insertion of the NOP command <N> is suppressed, thereby shortening the entry/exit transition time.

First Embodiment

Figure 12:
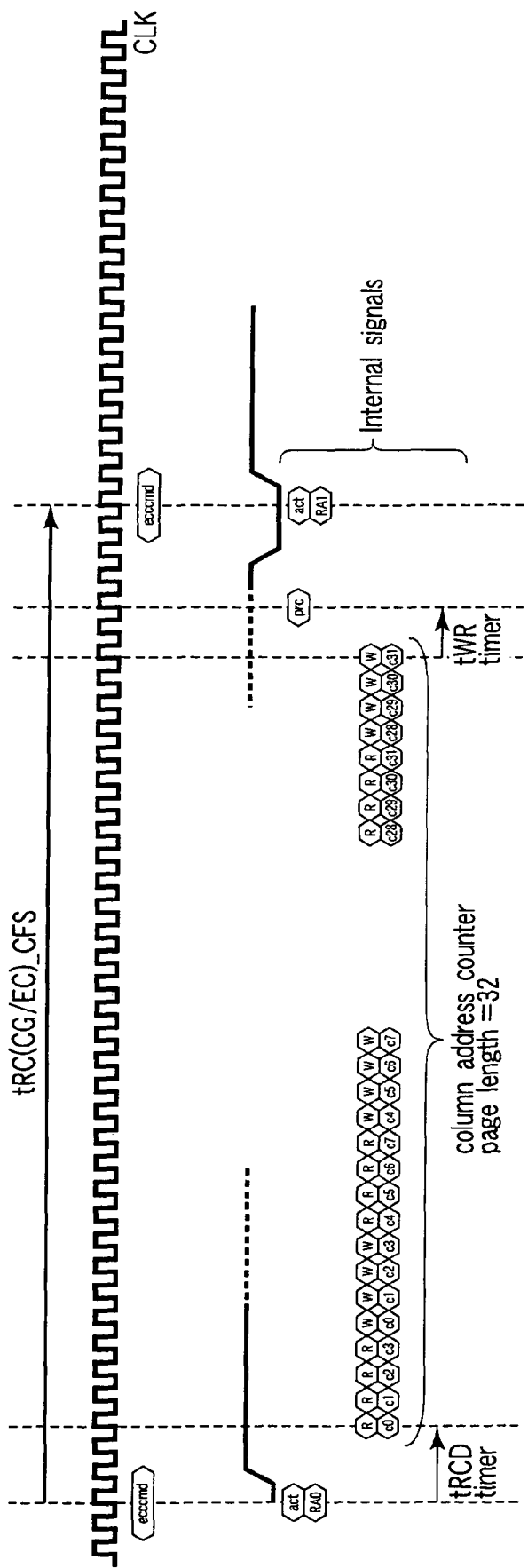
FIG. 12 is a timing chart for explaining the operation of a semiconductor memory device according to the first embodiment of the present invention.

FIG. 12 is a timing chart for explaining the operation of a semiconductor memory device according to the first embodiment of the present invention. An entry command <ecccmd> in FIG. 12 corresponds to an input signal (ECC command) to an ECC controller 32 shown in FIG. 7. When the entry command <ecccmd> is input and a row active command signal <act> in a DRAM macro is activated in synchronism with a system clock CLK, an internal counter 35 of the ECC controller 32 transmits a row address <RA0> to the interior of the macro, and a word line determined by the row address <RA0> is activated. After an elapse of time tRCD measured by an internal timer 36 of the ECC controller 32, a read command <R> is issued to read out data from a memory cell, and a write command <W> for writing data in a memory cell is issued, thereby performing a page operation. The read command <R> and write command <W> are generated in the ECC controller 32, and column addresses <c0> to <c31> are supplied from the internal counter 35 of the ECC controller 32. When this page operation is completed, after an elapse of time tWR which is determined from the last column command <c31> by the timer 36, an internal precharge command (row precharge signal) <prc> is issued to make the word line unselected.

In this operation, even when the read latency of a normal operation is 1 or 2, seamless access is made possible by performing write four times after four times of read by forcedly operating the memory by RL=3. Accordingly, no such pipeline disturbance as when an NOP command <N> is inserted occurs. Also, no register is necessary because the generated code and corrected decoded data are latched and written in the memory cell in the next cycle.

In the first embodiment, therefore, it is possible to optimize the pipeline configuration, and seamlessly perform data read, code generation, error detection and correction, code write, decoding, and rewrite. This can reduce extra registers, and shorten the entry/exit transition time.

The dynamic RAM data holding method described above can be generally expressed as follows. In the entry/exit period, read and write are performed by a page operation. When read latency=n, i.e., $\underline{n}$ cycles are necessary from the read command <R> to data output determination, one cycle is necessary for a write operation, and $\underline{m}$ cycles are necessary for an ECC operation, a page length $\underline{k}$ is the multiple of (n+m), and the page operation repeats (n+m)-time consecutive read and (n+m)-time consecutive write k/(n+m) times. In the embodiment shown in FIG. 12, n=3, m=1, and k=32, so page length k=32 is the multiple of n+m=3+1=4.

Second Embodiment

Figure 13:
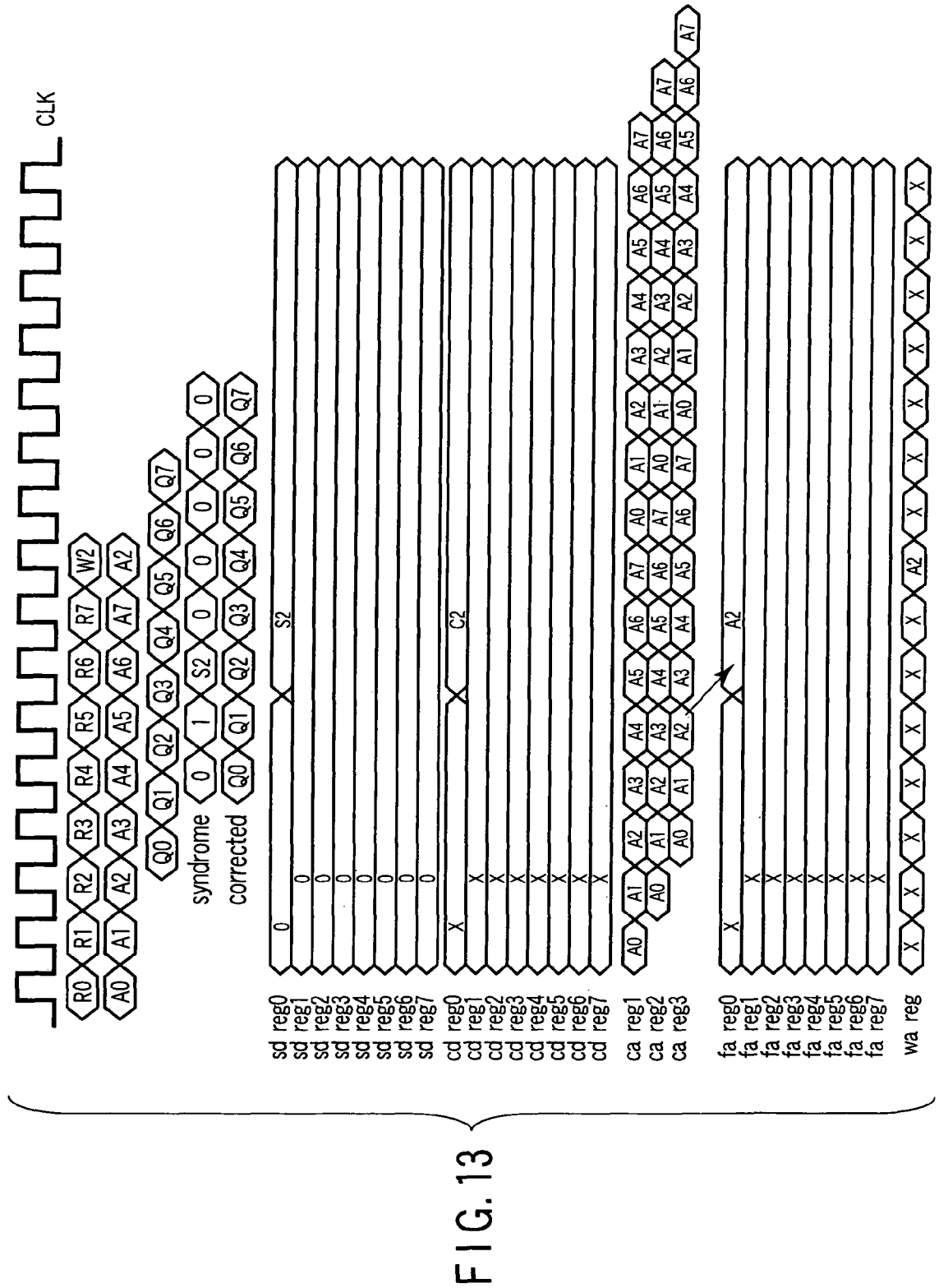
FIG. 13 is a timing chart for explaining a semiconductor memory device according to the second embodiment of the present invention, in which one error is contained in data read out from a memory cell designated by a column address in one page access.
Figure 14:
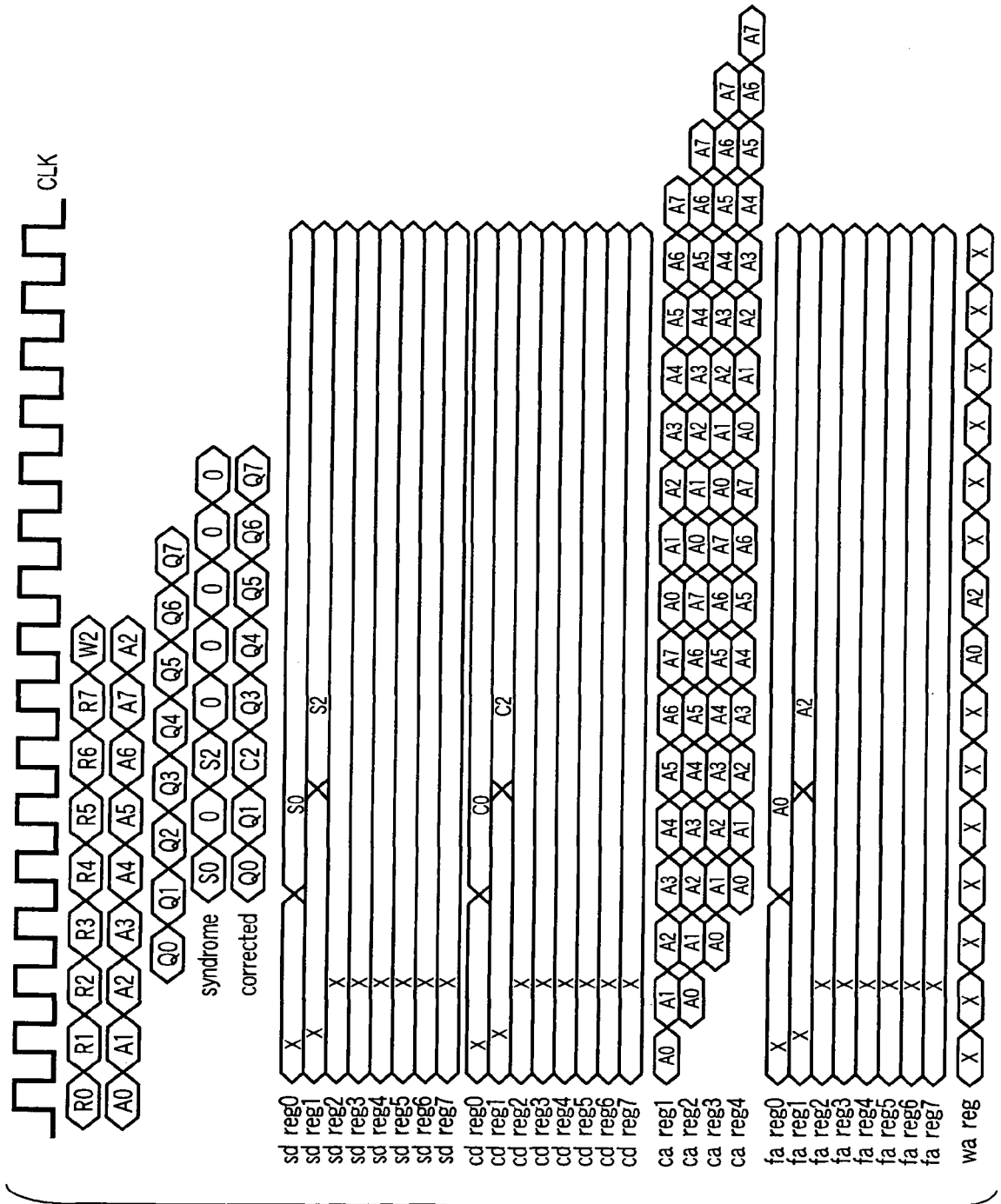
FIG. 14 is a timing chart for explaining the semiconductor memory device according to the second embodiment of the present invention, in which error correction occurs twice in a page.
Figure 15:
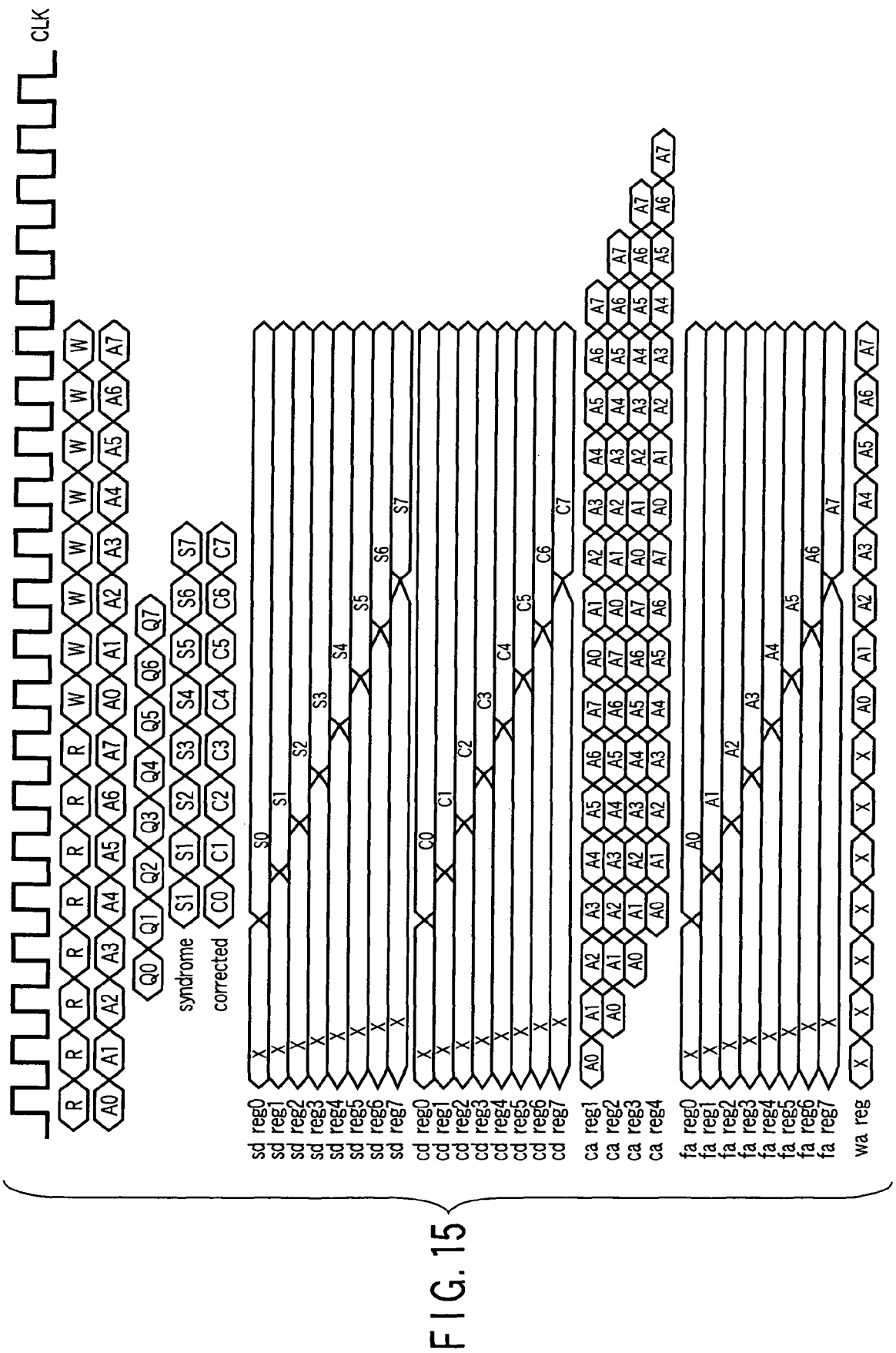
FIG. 15 is a timing chart for explaining the semiconductor memory device according to the second embodiment of the present invention, in which error correction occurs in all columns in a page.

FIGS. 13 to 15 are timing charts for explaining a semiconductor memory device according to the second embodiment of the present invention. The second embodiment shows a case in which page length=8.

FIG. 13 shows a case in which data Q2 read from a memory cell designated by a column address A2 contains an error in one page access, so a syndrome S2 changes to non-0 to make correction occur, and the received word (data read out from the memory cells) Q2 is corrected to a correct decoded word (corrected data) C2.

To implement this operation, registers are necessary in ECC circuits 16-1 and 16-2 and control circuit 17 shown in FIGS. 6 and 7. More specifically, page length=8 sets of syndrome registers (sd reg), decoded word registers (cd reg), and fail address registers (fa reg) and RL=3 sets of column address registers (ca reg) are necessary.

Syndrome registers sd reg0 to sd reg7 for holding generated syndromes are formed in a syndrome decoder 27 shown in FIG. 7. Decoded word registers cd reg0 to cd reg7 for holding decoded words are formed in an EC unit 25 shown in FIG. 7. Column address registers ca reg1 to ca reg3 are formed in an ECC controller 32 shown in FIG. 7, and used to hold column addresses output from a counter 35. When an error is detected, fail address registers fa reg0 to fa reg7 load the address of a memory cell from which the error data is read out, from the column address registers ca reg1 to ca reg3. The fail address registers fa reg0 to fa reg7 are also formed in the ECC controller 32.

If the received word Q2 has an error, the syndrome S2 changes to non-0. Consequently, the syndrome S2 is loaded into the syndrome register sd reg0. The value of each unloaded syndrome register is all 0.

Simultaneously, the corrected data C2 is loaded into the decoded word register cd reg0. Also, the column address A2 in which the error data is stored is loaded into the fail address register fa reg0.

When read of page length=8 cycles is completed, rewrite of the corrected data is immediately started. If the content of the syndrome register sd reg0 is non-0, the failed column address A2 stored in the fail address register fa reg0 is designated as a rewrite address together with a write command. Data to be rewritten is C2 stored in the decoded word register cd reg0, so the data C2 is rewritten.

Then, since the content of the syndrome register sd reg1 is 0, rewrite of the page is completed, so row precharge can start after an elapse of time tWR.

Although an arrangement having 136 bits of decoded word registers cd reg corresponding to the code length is the simplest, this number is large. Therefore, it is also possible to hold only one bit of decoded word data for which error correction has occurred, and rewrite only the one corrected bit by decoding the syndrome when the data is to be written.

In the second embodiment, a rewrite operation can be omitted when no error is found by the ECC function. This makes it possible to shorten the entry/exit transition time, and rapidly return to the normal operation mode from the data holding mode.

Note that the second embodiment requires registers, but the number of registers is smaller than the page length×code length bits.

FIG. 14 shows a case which is basically the same as FIG. 13 except that error correction occurs twice in a page. Since received words Q0 and Q2 have errors, syndromes S0 and S2 change to non-O. Consequently, the syndrome S0 is loaded into the syndrome register sd reg0, and the syndrome S2 is loaded into the syndrome register sd reg1. The value of each unloaded syndrome register is all 0.

Simultaneously, corrected data C0 is loaded into the decoded word register cd reg0, and corrected data C2 is loaded into the decoded word register cd reg1. Also, a column address A0 in which one error data is stored is loaded into the fail address register fa reg0, and a column address A2 in which the other error data is stored is loaded into the fail address register fa reg1.

When read of page length=8 cycles is completed, rewrite of the corrected data is immediately started. If the content of the syndrome register sd reg0 is non-0, the failed column address A0 stored in the fail address register fa reg0 is designated as a rewrite address together with a write command. Data to be rewritten is C0 stored in the decoded word register cd reg0, so the data C0 is rewritten.

Since the content of the syndrome register sd reg1 is also non-0, the failed column address A2 stored in the fail address register fa reg1 is designated as a rewrite address together with a write command. Data to be rewritten is C2 stored in the decoded word register cd reg1, so the data C2 is rewritten.

Then, since the content of the syndrome register sd reg2 is 0, rewrite of the page is completed, so row precharge can start after an elapse of time tWR.

FIG. 15 shows a case which is basically the same as FIG. 13 except that error correction occurs in all columns in a page. Since all received words Q0 to Q7 have errors, all syndromes S0 to S7 change to non-0. As a consequence, the syndromes S0 to S7 are loaded into the syndrome registers sd reg0 to sd reg7, respectively.

Simultaneously, corrected data C0 to C7 are loaded into the decoded word registers cd reg0 to cd reg7, respectively. Also, column addresses A0 to A7 in which the error data are stored are loaded into the fail address registers fa reg0 to fa reg7, respectively.

When read of page length=8 cycles is completed, rewrite of the corrected data is immediately started. Since the contents of the syndrome registers sd reg0 to sd reg7 are non-0, the failed column addresses A0 to A7 stored in the fail address registers fa reg0 to fa reg7 are designated as rewrite addresses together with a write command. Data to be rewritten are C0 to C7 stored in the decoded word registers cd reg0 to cd reg7, so the data C0 to C7 are rewritten.

When all the rewrite operations are completed, row precharge starts after an elapse of time tWR.

Third Embodiment

Figure 16:
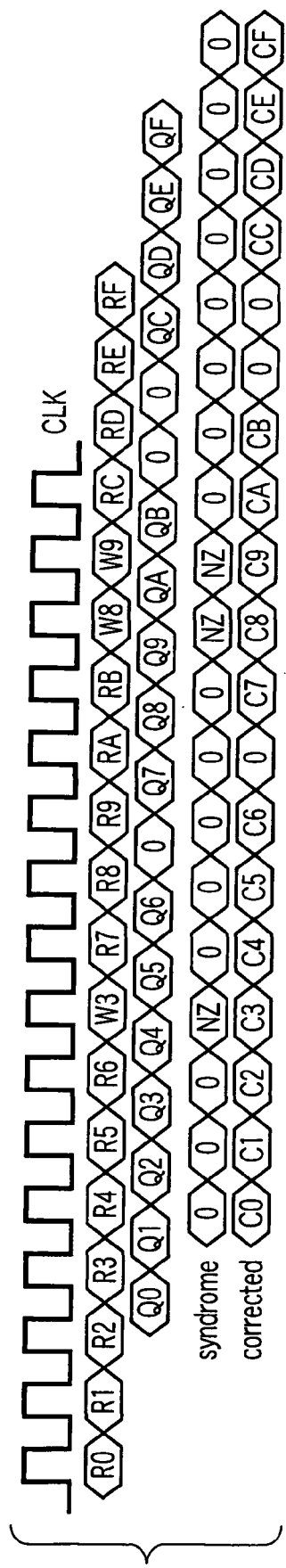
FIG. 16 is a timing chart for explaining a semiconductor memory device according to the third embodiment of the present invention.

FIG. 16 is a timing chart for explaining a semiconductor memory device according to the third embodiment of the present invention. In the third embodiment, if error correction occurs, rewrite is immediately performed in the next cycle.

FIG. 16 shows a case in which error correction and rewrite occur three times in a page. That is, received words Q3, Q8, and Q9 have errors, and data C3, C8, and C9 are rewritten.

A column address counter stops counting during the rewrite period, and restarts counting immediately after the rewrite is completed. Also, a rewrite address must be the same as the address of read data containing an error, so this rewrite address is newly generated or stored in a register. When data is to be read out and corrected data is to be rewritten by a page operation, an upper limit is set for the number of corrected data rewrite page cycles, and the number of times of rewrite is always set smaller than the page length.

In the third embodiment, therefore, when data is to be read out and corrected data is to be rewritten by a page operation, the exit transition time can be shortened, and the normal operation mode can be rapidly restored from the data holding mode.

Note that the number of registers need not be large because rewrite addresses need only be stored. Note also that the sum of the numbers of read operations and write operations of a page with respect to one row is desirably always smaller than the twofold of the page length.

Fourth Embodiment

Figure 17:
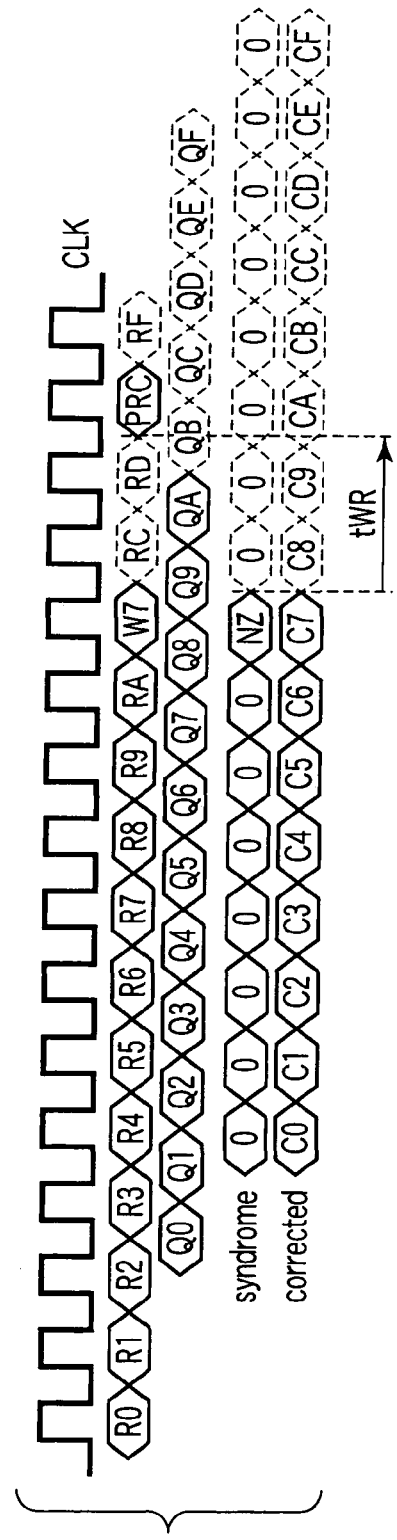
FIG. 17 is a timing chart for explaining a semiconductor memory device according to the fourth embodiment of the present invention.

FIG. 17 is a timing chart for explaining a semiconductor memory device according to the fourth embodiment of the present invention.

In this embodiment, a received word Q7 has an error, and data C7 is rewritten. That is, in the fourth embodiment, if error correction occurs even once in a page, rewrite is immediately performed. In addition, data read in the page is interrupted, and a row precharge <PRC> operation starts after an elapse of time tWR.

Note that in FIG. 17, the processing is completed when one error is corrected in a page. However, it is also possible to interrupt page access including read when correction has occurred twice, or the number of times smaller than the page length.

As described above, when data is to be read out to detect an error by a page operation, an upper limit is set for the number of times of error detection so that this number is smaller than the page length. If the number of times of error detection becomes equal to this upper limit, data read and the corresponding error correcting operation and corrected data rewrite operation in the page cycle are omitted after that. This makes it possible to shorten the entry/exit transition time, and rapidly restore the normal operation mode from the data holding mode.

Figure 19:
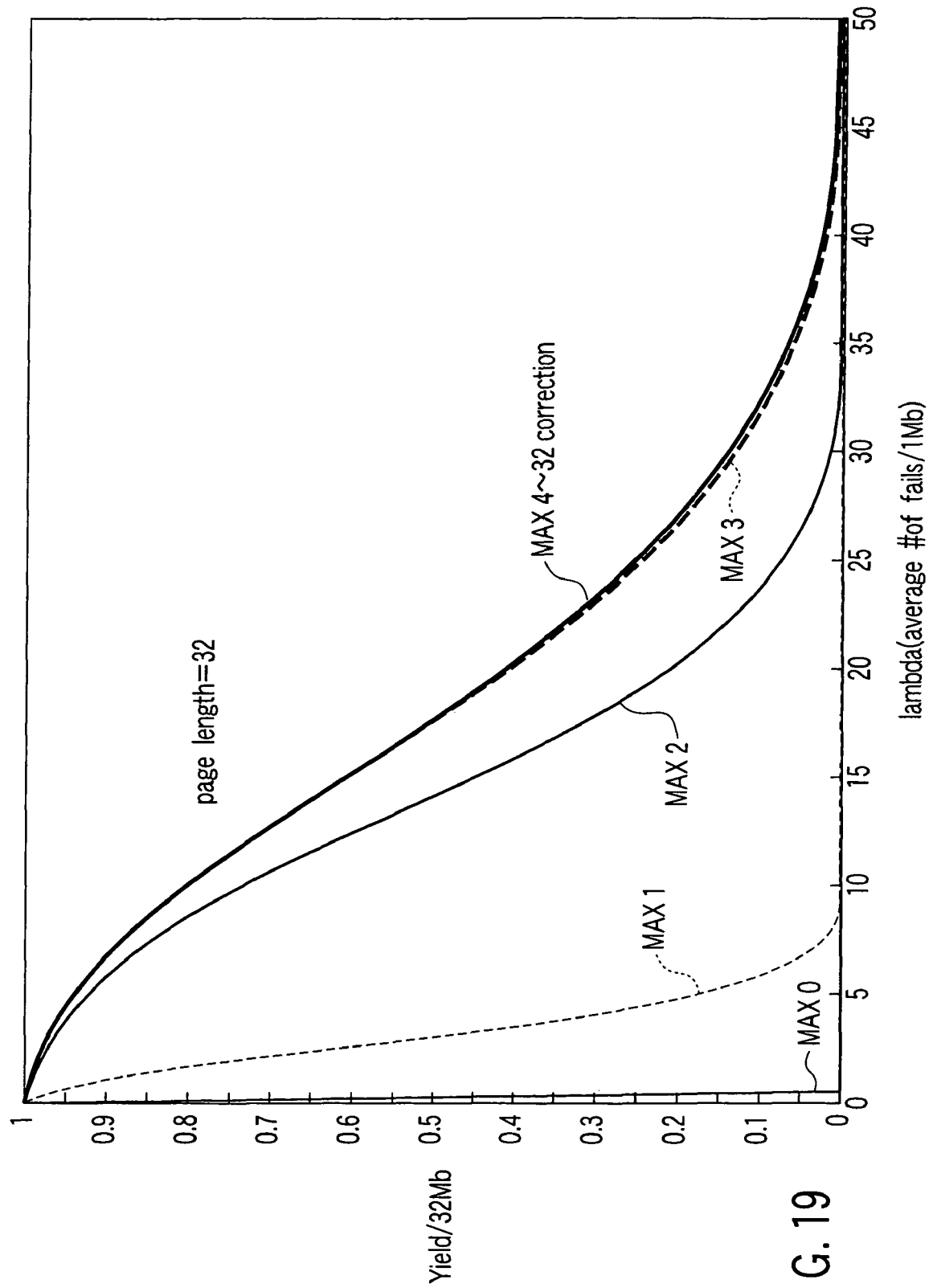
FIG. 19 is a graph showing the relief efficiency when the page length is 32 bits.
Figure 20:
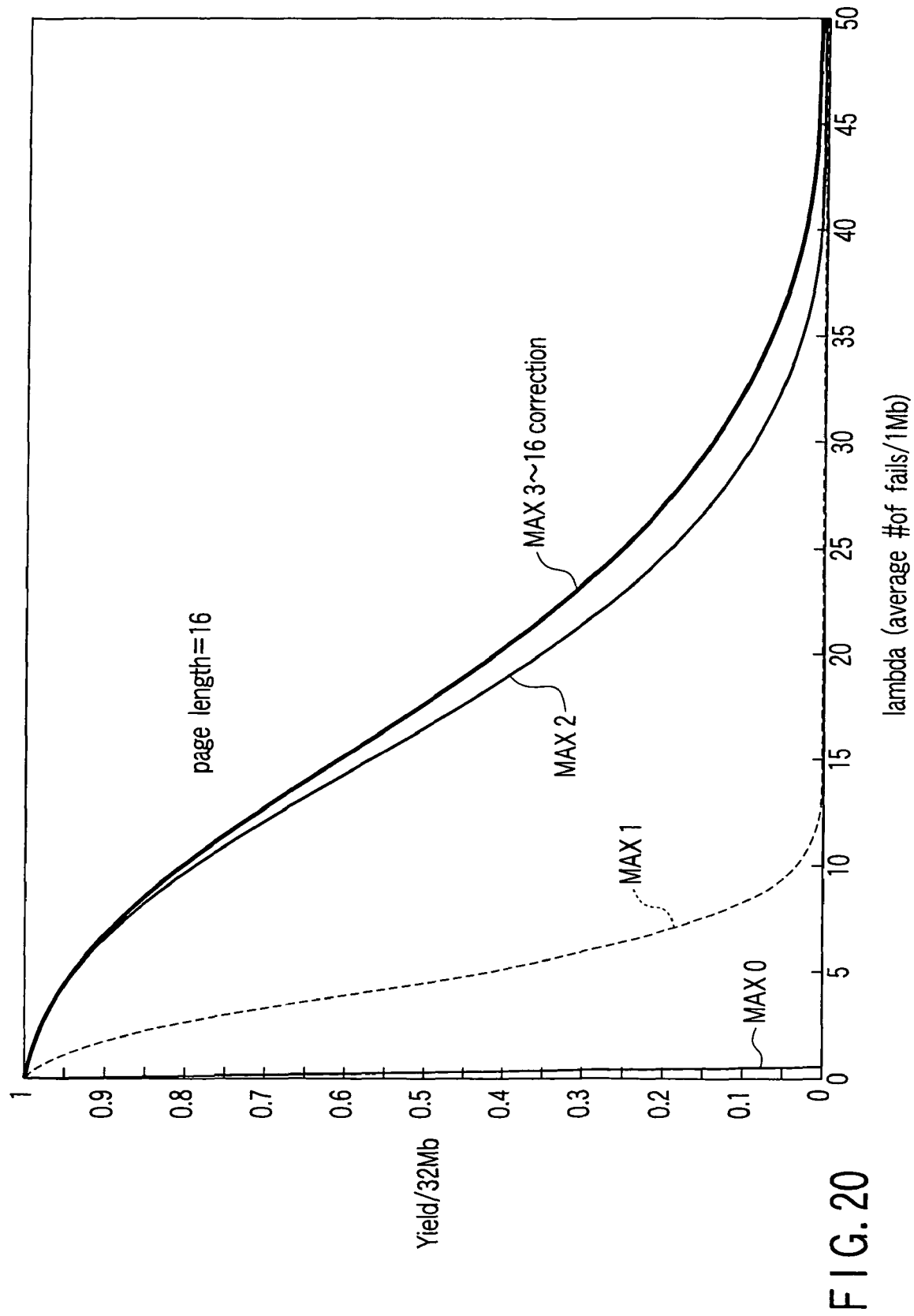
FIG. 20 is a graph showing the relief efficiency when the page length is 16 bits.

FIGS. 18, 19, and 20 illustrate the relief efficiencies when page length=128, 32, and 16, respectively. Further, "MAX" of FIGS. 18, 19, and 20 shows the upper limit of the number of times of error detection in one page operation. As shown in FIGS. 18, 19, and 20, correction need only be performed four to five times even when the number of times of error correction is decreased in a page.

To simplify the explanation, assume that retention failures occur at random.

Letting p be the 1-bit failure probability, an average failure count $\lambda$ per 1 Mbit is $\lambda=2^{20} \times p$.

Calculations are performed using a binomial distribution which can be either a Poisson distribution or Gaussian distribution.

Assume that:

the memory capacity is N=32 Mbits, n=information length=I/O count=bit width of data which undergoes read/write in one column access=128 bits, m=code length=136 bits, and
k=page length (e.g., 16, 32, and 128).
In this case, the yield when no ECC is performed is $$\text{Yield}=((1-p)^n)^{(N/n)}=(1-p)^N$$

The yield when ECC (one error correction/128 bits) is performed is $$\text{Yield}=((1-p)^m+m\times p\times(1-p)^{(m-1)})^{(N/n)}$$

The yield when ECC (correction is performed as many as $e$ times in a page) is performed is $$\text{Yield}=[\text{sum}(j=0\ldots e, \text{comb}(n,j)\times\{((1-p)^m)^{(k-j)}\times(m\times p\times(1-p)^{(m-1)})^j\})]^{(N/n/k)}$$

In the second to fourth embodiments described above, the length of one page cycle depends on the number of times of error correction in the page.

When making it generate inside the macro and carrying out ECC operation of the timing of all the internal signals like the self-refresh, i.e., when an output from a row/column address counter is loaded during the entry/exit period, a row active/precharge command, read/write command, and the like are automatically generated, and their timings are controlled by an internal timer, the overall exit transition time can be reduced by counting the number of times of error correction in a page, and controlling the timings of the various signals.

If, however, when it is the same operation as the auto-refresh, i.e., if not all timings are controlled by an internal timer but, e.g., a row active command alone is externally input, the row cycle time depends on the number of times of error correction in a page. This makes it impossible to determine the input timing of the external command.

To solve this problem, it is possible to output a signal indicating the end of the page cycle outside the memory, and allow the memory controller to receive this signal and issue the next row active command. It is also possible to define, as a specification, that the row cycle time of a page cycle in the entry/exit period is, e.g., 0.8 times that when full-page read/write is performed. When this method is actually performed, the worst case in which all error corrections which may exist in a page occur is a case in which error corrections occur in all columns in a page. However, the probability that a case like this happens is very low. Accordingly, even when write (or read and write) in the page cycle is omitted, the influence on the yield can be made negligibly small as shown in FIGS. 18 to 20. In this case, the overall exit transition time can be calculated from the memory capacity and page length. However, if refresh is necessary in the middle of the process, this refresh must be additionally taken into consideration.

In each embodiment of the present invention as described above, at the entry to the data holding mode, the operation of reading out data from a memory and generating and writing an error correction code in the memory is performed for all memory cells. At the exit, the operation of reading out the code from the memory, correcting the error, and rewriting the corrected data in the memory is performed. In a memory requiring refresh, e.g., in a DRAM, therefore, it is possible to improve the retention characteristics, prolong the refresh interval, and reduce the power consumption. Also, at the exit, code read, error detection, error correction, and corrected data rewrite are not performed for the entire memory requiring refresh. That is, if there is no error, some of these operations are omitted, and only minimum necessary operations are selectively performed. This can shorten the exit transition time and rapidly restore the normal operation mode. In addition, the optimization of the pipeline makes it possible to perform seamless page access, reduce the number of registers for holding the output from the ECC circuit, and avoid the use of extra registers. This increases the processing speed and reduces the pattern occupied area and chip cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   memory cells which dynamically hold data;
   ECC circuits which perform error correction on codes read out from the memory cells; and
   a control circuit which controls operations of the memory cells and operations of the ECC circuits, the control circuit performing control such that when the memory cells enter a data holding mode, a plurality of data are read out from the memory cells to generate and store a check bit for error detection and correction, and a refresh operation is performed in a period within an error occurrence allowable range of the error correcting operation performed by the ECC circuit by using the check bit, and, before a normal operation mode is restored from the data holding mode, an error bit of the data is corrected by using the check bit,
   wherein in an entry/exit period, read and write are performed by a page operation, and, when $n$ cycles are necessary from a read command to data output determination, one cycle is necessary for a write operation, and $m$ cycles are necessary for an ECC operation, a page length $k$ is a multiple of (n+m), and the page operation repeats (n+m)-time consecutive read and (n+m)-time consecutive write k/(n+m) times.

2. The device according to claim 1, wherein the memory cells, the ECC circuits, and the control circuit are parts of a DRAM macro.

3. The device according to claim 2, wherein
   the DRAM macro comprises a plurality of banks, secondary sense amplifiers formed between banks arranged along a first direction in which an input data line, an output data line, and a DQ line run in said plurality of banks, and decoder blocks formed between banks arranged along a second direction which intersects the first direction, and
   the ECC circuits are arranged adjacent to the secondary sense amplifiers at one end of the banks arranged along the first direction, and the control circuit is placed between the ECC circuits.

4. The device according to claim 3, wherein each of said plurality of banks comprises a plurality of memory cell arrays in which the memory cells are arranged, and sense amplifiers which alternately sandwich said plurality of memory cell arrays.

5. The device according to claim 3, wherein
   the ECC circuit comprises a read/write buffer and an ECC block,
   the read/write buffer comprises a read buffer controlled by a read clock signal, and a write buffer controlled by a write clock signal, and
   the ECC block comprises a buffer which is controlled by an ECC clock signal and receives readout data from the memory cell, an EC unit which receives an output signal from the buffer and corrects an error, a code generator/syndrome generator which generates a code and a syndrome on the basis of the output signal from the buffer, a syndrome decoder which decodes the syndrome generated by the code generator/syndrome generator, a first multiplexer which selects one of an output signal from the EC unit and an output signal from the code generator/ syndrome generator, and a second multiplexer which selects one of an output signal from the first multiplexer and data input from outside the DRAM macro.

6. The device according to claim 3, wherein the control circuit comprises an ECC controller and a block controller, the ECC controller comprises a counter which receives an entry command, and a timer which receives an output from the counter, and generates a signal for setting an operation timing, and the block controller comprises a multiplexer which receives an output signal from the ECC controller and an address and command input from outside the DRAM macro, controls an interior of the DRAM macro by selecting the address and the command in a normal operation, and selects the output signal from the ECC controller in an ECC operation, and an address and command buffer which receives an output signal from the multiplexer, an address, and a command, supplies an internal address and a command to the memory cell, and supplies a read clock signal, a write clock signal, and an ECC clock signal to the ECC circuit.

7. A semiconductor memory device comprising:

memory cells which dynamically hold data;

ECC circuits which have first registers and perform error correction on codes read out from the memory cells; and a control circuit which has a second register and controls operations of the memory cells and operations of the ECC circuits, the control circuit performing control such that when the memory cells enter a data holding mode, a plurality of data are read out from the memory cells to generate and store a check bit for error detection and correction, and a refresh operation is performed in a period within an error occurrence allowable range of the error correcting operation performed by the ECC circuit by using the check bit, and, before a normal operation mode is restored from the data holding mode, an error bit of the data is corrected by using the check bit, wherein in an exit period, a continuous read operation is performed by a page operation, and the ECC circuit performs an error correcting operation on a readout code, when correction occurs, corrected data is stored in the first register, and a column address storing a code for which correction has occurred is stored in the second register, and immediately after a last command of the continuous read of the page is input, the corrected data stored in the first register is rewritten in the memory cell which designates column address stored in the second register.

8. The device according to claim 7, wherein the maximum number of corrected data to be rewritten in the page is always smaller than a page length.

9. The device according to claim 7, wherein the memory cells, the ECC circuits, and the control circuit are parts of a DRAM macro.

10. The device according to claim 9, wherein the DRAM macro comprises a plurality of banks, secondary sense amplifiers formed between banks arranged along a first direction in which an input data line, an output data line, and a DQ line run in said plurality of banks, and decoder blocks formed between banks arranged along a second direction which intersects the first direction, and the ECC circuits are arranged adjacent to the secondary sense amplifiers at one end of the banks arranged along the first direction, and the control circuit is placed between the ECC circuits.

11. The device according to claim 10, wherein each of said plurality of banks comprises a plurality of memory cell arrays in which the memory cells are arranged, and sense amplifiers which alternately sandwich said plurality of memory cell arrays.

12. The device according to claim 9, wherein the ECC circuit comprises a read/write buffer and an ECC block, the read/write buffer comprises a read buffer controlled by a read clock signal, and a write buffer controlled by a write clock signal, and the ECC block comprises a buffer which is controlled by an ECC clock signal and receives readout data from the memory cell, an EC unit which receives an output signal from the buffer and corrects an error, a code generator/syndrome generator which generates a code and a syndrome on the basis of the output signal from the buffer, a syndrome decoder which decodes the syndrome generated by the code generator/syndrome generator, a first multiplexer which selects one of an output signal from the EC unit and an output signal from the code generator/syndrome generator, and a second multiplexer which selects one of an output signal from the first multiplexer and data input from outside the DRAM macro.

13. The device according to claim 9, wherein the control circuit comprises an ECC controller and a block controller, the ECC controller comprises a counter which receives an entry command, and a timer which receives an output from the counter, and generates a signal for setting an operation timing, and the block controller comprises a multiplexer which receives an output signal from the ECC controller and an address and command input from outside the DRAM macro, controls an interior of the DRAM macro by selecting the address and the command in a normal operation, and selects the output signal from the ECC controller in an ECC operation, and an address and command buffer which receives an output signal from the multiplexer, an address, and a command, supplies an internal address and a command to the memory cell, and supplies a read clock signal, a write clock signal, and an ECC clock signal to the ECC circuit.

14. A semiconductor memory device comprising:

memory cells which dynamically hold data;

ECC circuits which perform error correction on codes read out from the memory cells; and a control circuit which has an address counter and controls operations of the memory cells and operations of the ECC circuits, the control circuit performing control such that when the memory cells enter a data holding mode, a plurality of data are read out from the memory cells to generate and store a check bit for error detection and correction, and a refresh operation is performed in a period within an error occurrence allowable range of the error correcting operation performed by the ECC circuit by using the check bit, and, before a normal operation mode is restored from the data holding mode, an error bit of the data is corrected by using the check bit, wherein in an exit period, a continuous read operation is performed by a page operation for a column address supplied from the address counter, and the ECC circuit performs an error correcting operation on a readout code, and when correction occurs, the address counter is stopped, corrected data is rewritten at a column address which designates a location in which the correction occurs data is stored, and the address counter is restarted to continue the read operation after the rewrite is completed.

15. The device according to claim 14, wherein a sum of the numbers of read operations and write operations for one row is always smaller than a twofold of a page length.

16. The device according to claim 14, wherein the memory cells, the ECC circuits, and the control circuit are parts of a DRAM macro.

17. The device according to claim 16, wherein the DRAM macro comprises a plurality of banks, secondary sense amplifiers formed between banks arranged along a first direction in which an input data line, an output data line, and a DQ line run in said plurality of banks, and decoder blocks formed between banks arranged along a second direction which intersects the first direction, and the ECC circuits are arranged adjacent to the secondary sense amplifiers at one end of the banks arranged along the first direction, and the control circuit is placed between the ECC circuits.

18. The device according to claim 17, wherein each of said plurality of banks comprises a plurality of memory cell arrays in which the memory cells are arranged, and sense amplifiers which alternately sandwich said plurality of memory cell arrays.

19. The device according to claim 16, wherein the ECC circuit comprises a read/write buffer and an ECC block, the read/write buffer comprises a read buffer controlled by a read clock signal, and a write buffer controlled by a write clock signal, and the ECC block comprises a buffer which is controlled by an ECC clock signal and receives readout data from the memory cell, an EC unit which receives an output signal from the buffer and corrects an error, a code generator/syndrome generator which generates a code and a syndrome on the basis of the output signal from the buffer, a syndrome decoder which decodes the syndrome generated by the code generator/syndrome generator, a first multiplexer which selects one of an output signal from the EC unit and an output signal from the code generator/syndrome generator, and a second multiplexer which selects one of an output signal from the first multiplexer and data input from outside the DRAM macro.

20. The device according to claim 16, wherein the control circuit comprises an ECC controller and a block controller, the ECC controller comprises a counter which receives an entry command, and a timer which receives an output from the counter, and generates a signal for setting an operation timing, and the block controller comprises a multiplexer which receives an output signal from the ECC controller and an address and command input from outside the DRAM macro, controls an interior of the DRAM macro by selecting the address and the command in a normal operation, and selects the output signal from the ECC controller in an ECC operation, and an address and command buffer which receives an output signal from the multiplexer, an address, and a command, supplies an internal address and a command to the memory cell, and supplies a read clock signal, a write clock signal, and an ECC clock signal to the ECC circuit.

* * * * *